United States Patent
Higuchi et al.

(10) Patent No.: US 6,501,160 B1
(45) Date of Patent: Dec. 31, 2002

(54) SEMICONDUCTOR DEVICE AND A METHOD OF MANUFACTURING THE SAME AND A MOUNT STRUCTURE

(75) Inventors: Akira Higuchi, Takasaki (JP); Ichio Shimizu, Tamamura (JP); Munehisa Kishimoto, Kamakura (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/481,594

(22) Filed: Jan. 12, 2000

(30) Foreign Application Priority Data

Jan. 29, 1999 (JP) .......................................... 11-021240

(51) Int. Cl.⁷ .......................................... H01L 23/495
(52) U.S. Cl. ..................... 257/675; 257/666; 257/669; 257/676; 257/796; 257/707; 257/734; 257/784
(58) Field of Search ................................ 257/675, 666, 257/669, 676, 796, 707

(56) References Cited

U.S. PATENT DOCUMENTS

| | | | | |
|---|---|---|---|---|
| 4,918,511 A | * | 4/1990 | Brown | 357/70 |
| 5,287,003 A | * | 2/1994 | Van Andel et al. | 257/792 |
| 5,298,791 A | * | 3/1994 | Liberty et al. | 257/707 |
| 5,712,507 A | * | 1/1998 | Eguchi et al. | 257/666 |
| 5,731,632 A | * | 3/1998 | Kozono | 257/717 |
| 6,025,650 A | * | 2/2000 | Tsuji et al. | 257/786 |
| 6,211,462 B1 | * | 3/2001 | Carter, Jr. et al. | 174/52.4 |
| 6,319,753 B1 | * | 11/2001 | Ichikawa et al. | 438/112 |

FOREIGN PATENT DOCUMENTS

| | | |
|---|---|---|
| JP | 61-216454 | 9/1986 |
| JP | 4-317360 | 11/1992 |
| JP | 5-291459 | 11/1993 |
| JP | 8-130273 | 5/1996 |

* cited by examiner

*Primary Examiner*—Tom Thomas
*Assistant Examiner*—Nitin Parekh
(74) *Attorney, Agent, or Firm*—Mattingly, Stanger & Malur, P.C.

(57) ABSTRACT

The present invention provides a technique capable of improving a mounting failure in a resin encapsulated semiconductor device and repairability thereof.

The present semiconductor device includes a resin encapsulater, a semiconductor chip located within the resin encapsulater and having a plurality of electrodes on one main surface, a semiconductor chip loading portion disposed within the resin encapsulater and having a loaded surface for mounting the semiconductor chip thereon and an unloaded surface provided on the side opposite to the loaded surface, and a plurality of input/output leads which are connected to the plurality of electrodes to input signals to the plurality of electrodes of the semiconductor chip or output signals from the plurality of electrodes thereof and which extend outside the resin encapsulater. Further, the unloaded surface of the semiconductor chip loading portion comprises a plurality of regions separated from one another and the plurality of regions are exposed from the resin encapsulater.

35 Claims, 16 Drawing Sheets

☐ : EXPOSED REGIONS
▨ : TRENCHES (CONCAVE PORTIONS)

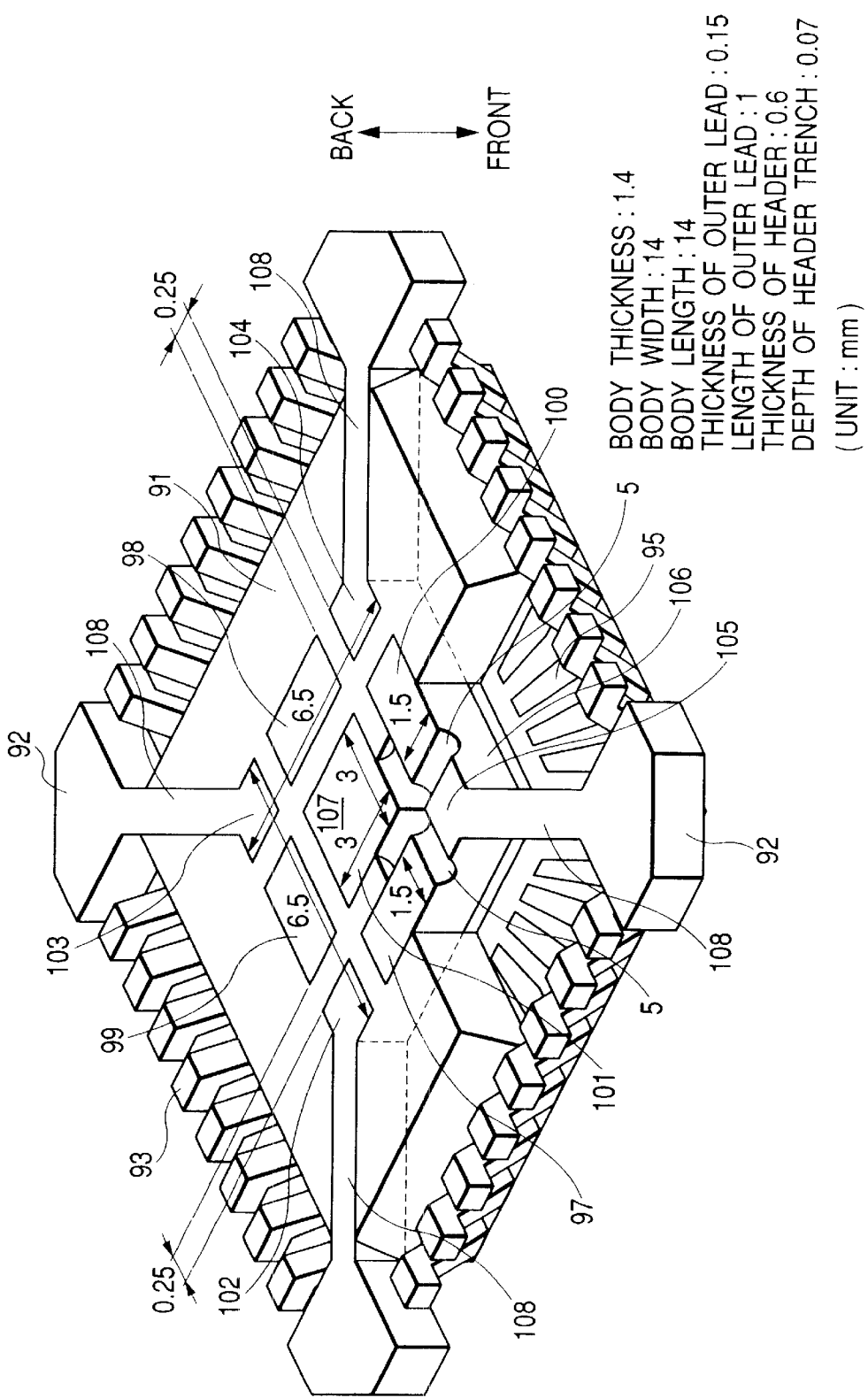

SEMICONDUCTOR DEVICE AND A METHOD OF MANUFACTURING THE SAME AND A MOUNT STRUCTURE

BACKGROUND OF THE INVENTION

The present invention relates to a semiconductor device, and particularly to a technique capable of improving a mounting failure in a resin encapsulated semiconductor device and improving repairability thereof. This invention is particularly concerned with a technique effective for use in a resin encapsulated semiconductor device in which surface mounting is performed.

A resin encapsulated semiconductor device (hereinafter called "IC package") in which surface mounting is performed, comprises a semiconductor chip in which an integrated circuit including a semiconductor element is fabricated and built therein, a semiconductor chip mounting or loading portion such as a tub or heat sink on which the semiconductor chip is mounted, a plurality of inner leads electrically connected to their corresponding bonding pads of the semiconductor chip through bonding wires, outer leads integrally connected to the respective inner leads respectively, and a resin encapsulater which seals the semiconductor chip, semiconductor chip loading portion and respective inner leads with a resin. The exposing of a main surface of the semiconductor chip loading portion, which is located on the side opposite to a main surface thereof on the semiconductor chip loading side, from a surface below the resin encapsulater is considered as means for enhancing heat radiation performance in the present resin encapsulated semiconductor device.

Examples descriptive of a resin encapsulated semiconductor device wherein surface mounting is carried out in which a tub corresponding to a semiconductor chip loading portion is exposed or made bare to a surface below a resin encapsulater, have been disclosed in Japanese Patent Application Laid-Open Nos. Hei 4-317360 and 5-291459 and Sho 61-216454. Further, an example of a resin encapsulated semiconductor device wherein surface mounting is performed in which a heat sink corresponding to a semiconductor chip loading portion is exposed from a surface below a resin encapsulater, has been disclosed in Japanese Patent Application Laid-Open No. Hei 8-130273. In the package wherein the tub or heat sink is made bare to the surface below each of these resin encapsulaters, the exposed tub or heat sink is soldered to each land of a printed wiring board serving as a printed circuit board, whereby the generated heat of a chip can be radiated from the tub or heat sink to the printed wiring board through soldered portions by thermal conduction.

SUMMARY OF THE INVENTION

In the above-described resin encapsulated semiconductor device, however, the semiconductor chip loading portion such as the tub or heat sink with the semiconductor chip mounted thereon increases in size as the semiconductor chip increases in size. It has been defined by the inventors that when such a resin encapsulated semiconductor device is soldered to lands on a printed circuit board, molten solder below the semiconductor chip loading portion is made one-sided or unbalanced as shown in FIG. 20, so that a mounting failure occurs that the resin encapsulated semiconductor device is inclined and leads on the floated side of the resin encapsulated semiconductor device are not connected to their corresponding lands on the printed circuit board. A problem that when a resin encapsulated semiconductor device surface-mounted on a printed circuit board is taken off from the printed circuit board for the purpose of repair (e.g., repair at a mounting test, repair in its practical use and the like) resultant from some reasons even where the above-described mounting failure is not produced, heat to melt solder is hard to be transferred to a central portion of a solder connecting surface of a semiconductor chip loading portion such as the tub or heat sink connected to lands on the printed circuit board by solder, and repairability is also poor, has been also revealed by the inventors.

An object of the present invention is to provide a resin encapsulated semiconductor device capable of preventing the inclination thereof upon surface mounting thereof onto a printed circuit board to thereby prevent a mounting failure from occurring.

Another object of the present invention is to provide a resin encapsulated semiconductor device capable of improving repairability of the resin encapsulated semiconductor device surface-mounted on a printed circuit board.

A further object of the present invention is to provide a method of manufacturing a resin encapsulated semiconductor device, which is capable of preventing the inclination thereof upon surface mounting thereof on a printed circuit board and thereby preventing a mounting failure from occurring.

A still further object of the present invention is to provide a method of manufacturing a resin encapsulated semiconductor device, which is capable of improving repairability of the resin encapsulated semiconductor device surface-mounted on a printed circuit board.

A still further object of the present invention is to provide a mount structure wherein a resin encapsulated semiconductor device surface-mounted on a printed circuit board is mounted on the printed circuit board without its inclination on the printed circuit board.

The above, other objects and novel features of the present invention will become apparent from the description of the specification of the present application and the accompanying drawings.

Summaries of typical ones of the inventions disclosed in the present application will be explained in brief as follows.

Namely, a resin encapsulated semiconductor device according to one aspect of the present invention comprises a resin encapsulater, a semiconductor chip located within the resin encapsulater and having a plurality of electrodes on one main surface, a semiconductor chip loading portion disposed within the resin encapsulater and having a loaded surface for mounting the semiconductor chip thereon and an unloaded surface provided on the side opposite to the loaded surface, and a plurality of input/output leads which are connected to the plurality of electrodes to input signals to the plurality of electrodes of the semiconductor chip or output signals from the plurality of electrodes thereof and which extend outside the resin encapsulater, and wherein the unloaded surface of the semiconductor chip loading portion comprises a plurality of regions separated from one another and the plurality of regions are exposed from the resin encapsulater.

A resin encapsulated semiconductor device according to another aspect of the present invention comprises a semiconductor chip having a plurality of electrodes on one main surface, a semiconductor chip loading portion having a main surface on which the semiconductor chip is mounted, a plurality of input/output leads which are connected to the plurality of electrodes to input signals to the plurality of electrodes of the semiconductor chip or output signals from the plurality of electrodes thereof and which extend in a direction far away from the semiconductor chip, and a resin encapsulater which seals the semiconductor chip, the semiconductor chip loading portion and some of the plurality of input/output leads, and wherein the other main surface of the semiconductor chip loading portion, which is provided on the side opposite to the main surface on which the semiconductor chip is mounted, is separated into a plurality of regions by a substance hard to be wet with a brazing filler metal and exposed from the resin encapsulater.

A resin encapsulated semiconductor device according to a further aspect of the present invention comprises a semiconductor chip having a plurality of electrodes on one main surface, a semiconductor chip loading portion having a main surface on which the semiconductor chip is mounted, a plurality of inner leads having one ends adjacent to the semiconductor chip, a plurality of outer leads integral with the plurality of inner leads respectively, connectors which respectively electrically connect the plurality of electrodes of the semiconductor chip and the plurality of inner leads to one another, and a resin encapsulater which seals the semiconductor chip, the semiconductor chip loading portion and the plurality of inner leads, and wherein the other main surface of the semiconductor chip loading portion, which is provided on the side opposite to the main surface on which the semiconductor chip is mounted, is exposed from the resin encapsulater, and the other main surface of the semiconductor chip loading portion, which is exposed from the resin encapsulater, is comprised of a plurality of exposed regions separated from one another by a substance hard to be wet with a brazing filler metal.

A resin encapsulated semiconductor device according to a still further aspect of the present invention comprises a semiconductor chip having a plurality of electrodes on one main surface, a semiconductor chip loading portion having a main surface on which the semiconductor chip is mounted, a plurality of inner leads having one ends adjacent to the semiconductor chip, a plurality of outer leads integral with the plurality of inner leads respectively, connectors which respectively electrically connect the plurality of electrodes of the semiconductor chip and the plurality of inner leads to one another, and a resin encapsulater which seals the semiconductor chip, the semiconductor chip loading portion and the plurality of inner leads, and wherein the other main surface of the semiconductor chip loading portion, which is provided on the side opposite to the main surface on which the semiconductor chip is mounted, is exposed from the resin encapsulater, and the other main surface of the semiconductor chip loading portion, which is exposed from the resin encapsulater, is comprised of a plurality of exposed regions separated from one another by a resin embedded in the semiconductor chip loading portion from the other main surface of the semiconductor chip loading portion.

A resin encapsulated semiconductor device according to a still further aspect of the present invention comprises a resin encapsulater, a semiconductor chip located inside the resin encapsulater and having a plurality of electrodes on one main surface, a semiconductor chip loading portion having a loaded surface for mounting the semiconductor chip thereon and an unloaded surface provided on the side opposite to the loaded surface, a plurality of inner leads having one ends adjacent to the semiconductor chip, and connectors which respectively electrically connect the plurality of electrodes of the semiconductor chip and the plurality of inner leads to one another, and wherein the other ends of the plurality of inner leads are integral with a plurality of outer leads extending outside the resin encapsulater, and the unloaded surface of the semiconductor chip loading portion is comprised of a plurality of regions separated from one another by a solder resist, which are exposed from one surface of the resin encapsulater.

A resin encapsulated semiconductor device according to a still further aspect of the present invention comprises a resin encapsulater, a semiconductor chip having a plurality of electrodes on one main surface, a semiconductor chip loading portion having a loaded surface for mounting the semiconductor chip thereon and an unloaded surface provided on the side opposite to the loaded surface, a plurality of inner leads having one ends adjacent to the semiconductor chip, and connectors which respectively electrically connect the plurality of electrodes of the semiconductor chip and the plurality of inner leads to one another, and wherein the other ends of the plurality of inner leads are integral with a plurality of outer leads extending outside the resin encapsulater, and the unloaded surface of the semiconductor chip loading portion is comprised of a plurality of regions separated from one another by a substance hard to be wet with solder which selectively protrude from the unloaded surface, which regions are exposed from one surface of the resin encapsulater.

A resin encapsulated semiconductor device according to a still further aspect of the present invention comprises a semiconductor chip having a plurality of electrodes on one main surface, a tub having a main surface on which the semiconductor chip is mounted, a plurality of inner leads having one ends adjacent to the semiconductor chip, a plurality of outer leads integral with the plurality of inner leads respectively, connectors which respectively electrically connect the plurality of electrodes of the semiconductor chip and the inner leads to one another, and a resin encapsulater which seals the semiconductor chip, the tub and the plurality of inner leads, and wherein the other main surface of the tub, which is provided on the side opposite to the main surface on which the semiconductor chip is mounted, is exposed from the resin encapsulater, and the other main surface of the tub, which is exposed from the resin encapsulater, is comprised of a plurality of exposed regions separated from one another by a substance hard to be wet with solder.

A resin encapsulated semiconductor device according to a still further aspect of the present invention comprises a semiconductor chip having a plurality of electrodes on one main surface, a heat sink having a main surface on which the semiconductor chip is mounted, a plurality of inner leads having one ends adjacent to the periphery of the semiconductor chip, a plurality of outer leads integral with the plurality of inner leads respectively, connectors which respectively electrically connect the plurality of electrodes of the semiconductor chip and the inner leads to one another, and a resin encapsulater which seals the semiconductor chip, the heat sink and the plurality of inner leads, and wherein the other main surface of the heat sink, which is provided on the side opposite to the main surface on which the semiconductor chip is mounted, is exposed from the resin encapsulater, and the other main surface of the heat sink, which is exposed from the resin encapsulater, is comprised of a plurality of exposed regions separated from one another by a substance hard to be wet with solder.

Further, a method of manufacturing a resin encapsulated semiconductor device, according to one aspect of the present invention, comprises the following steps: a step for preparing a lead frame having a semiconductor chip loading portion including a main surface with a semiconductor chip mounted thereon and the other main surface provided on the side opposite to the main surface and positioned below the main surface, and recessed portions which are defined in the other main surface and separate the other main surface into plural form; and a plurality of leads each having a first surface placed adjacent to the semiconductor chip loading portion and a second surface provided on the side opposite to the first surface, located below the first surface and located above the other main surface of the semiconductor chip loading portion; a step for preparing a semiconductor chip having a plurality of electrodes on one main surface; a step for connecting the semiconductor chip to the main surface of the semiconductor chip loading portion of the lead frame; a step for connecting the plurality of leads and the plurality of electrodes provided on one main surface of the semiconductor chip to one another by connecting means; and a step for placing the lead frame connected with the semiconductor chip so that the other main surface of the semiconductor chip loading portion makes contact with a cavity surface of a mold having a cavity and sealing the semiconductor chip, some of the plurality of leads and the semiconductor chip loading portion by a resin.

Furthermore, a mount structure according to one aspect of the present invention comprises a semiconductor device including a semiconductor chip having a plurality of electrodes on one main surface, a semiconductor chip loading portion having a main surface on which the semiconductor chip is mounted, a plurality of input/output leads which are respectively connected to the plurality of electrodes to input signals to the plurality of electrodes of the semiconductor chip or output signals from the plurality of electrodes thereof and extend in a direction far away from the semiconductor chip, and a resin encapsulater which seals the semiconductor chip, the semiconductor chip loading portion and some of the plurality of input/output leads and wherein the other main surface of the semiconductor chip loading portion, which is located on the side opposite to the main surface on which the semiconductor chip is mounted, is separated into a plurality of regions by a substance hard to be wet with a brazing filler metal, and exposed from the resin encapsulater; and a printed circuit board having a surface on which a plurality of first lands having the same patterns as the plurality of exposed regions constituting an unloaded surface of the semiconductor chip loading portion of the semiconductor device and a plurality of second lands corresponding to the plurality of input/output leads of the semiconductor device are formed; and wherein the semiconductor device is soldered to the plurality of first and second lands.

A mount structure according to another aspect of the present invention comprises a semiconductor device including a semiconductor chip having a plurality of electrodes on one main surface, a semiconductor chip loading portion having a main surface on which the semiconductor chip is mounted, a plurality of inner leads having one ends adjacent to the semiconductor chip, a plurality of outer leads integral with the plurality of inner leads respectively, connectors which respectively electrically connect the plurality of electrodes of the semiconductor chip and the plurality of inner leads to one another, and a resin encapsulater which seals the semiconductor chip, the semiconductor chip loading portion and the plurality of inner leads and wherein the other main surface of the semiconductor chip loading portion, which is located on the side opposite to the main surface on which the semiconductor chip is mounted, is exposed from the resin encapsulater, and the other main surface of the semiconductor chip loading portion, which is exposed from the resin encapsulater, is comprised of a plurality of exposed regions separated from one another by a resin embedded in the semiconductor chip loading portion from the other main surface of the semiconductor chip loading portion; and a printed circuit board having a surface on which a plurality of first lands having the same patterns as the plurality of exposed regions constituting the other main surface of the semiconductor chip loading portion of the semiconductor device and a plurality of second lands corresponding to the plurality of outer leads of the semiconductor device are formed; and wherein the semiconductor device is soldered to the plurality of first and second lands of the printed circuit board.

BRIEF DESCRIPTION OF THE DRAWINGS

The present invention will be described with reference to the accompanying drawings in which:

FIG. 4 is a view illustrating a unit lead frame constituting a multiple lead frame used for manufacturing the resin encapsulated semiconductor device according to the first embodiment of the present invention, wherein

FIG. 6 shows a state of the unit lead frame shown in FIG. 4, to which a semiconductor chip has been fixed or adhered and wires have been bonded, wherein

FIG. 8 is a view showing a state of the lead frame withdrawn from the mold in a state of a unit lead frame, wherein

FIG. 11 is a view showing a state in which the resin encapsulated semiconductor device shown in FIGS. 1 and 2 is mounted on the printed circuit board, wherein

FIG. 18 is a partly broken perspective view of the resin encapsulated semiconductor device shown in FIG. 17, whose front and back are upside down;

DESCRIPTION OF THE PREFERRED EMBODIMENTS

Preferred embodiments of the present invention will hereinafter be described in detail with reference to the accompanying drawings.

First Embodiment

Figure 1:
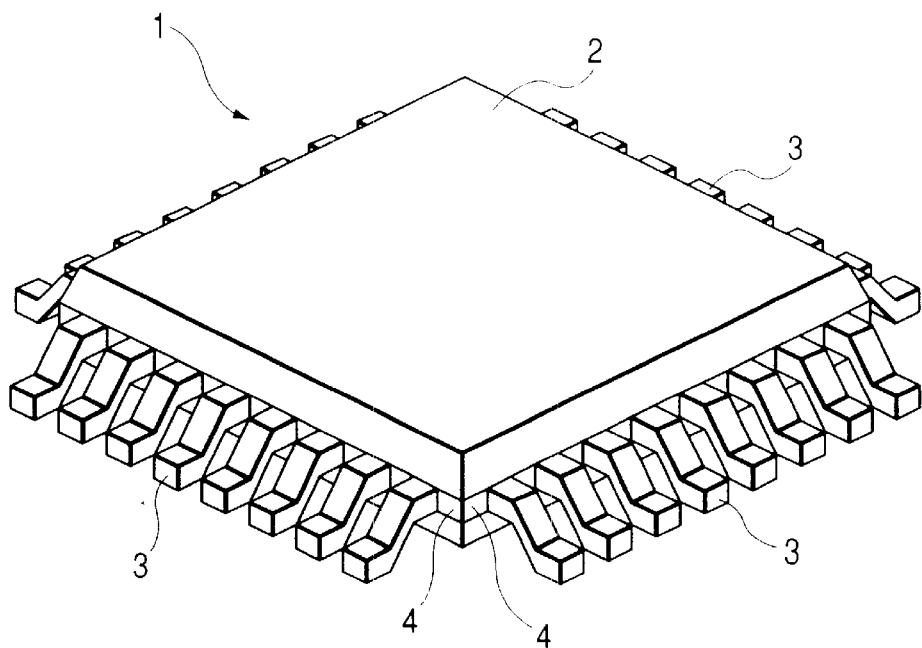
FIG. 1 is a perspective view showing a resin encapsulated semiconductor device according to a first embodiment of the present invention.
Figure 2:
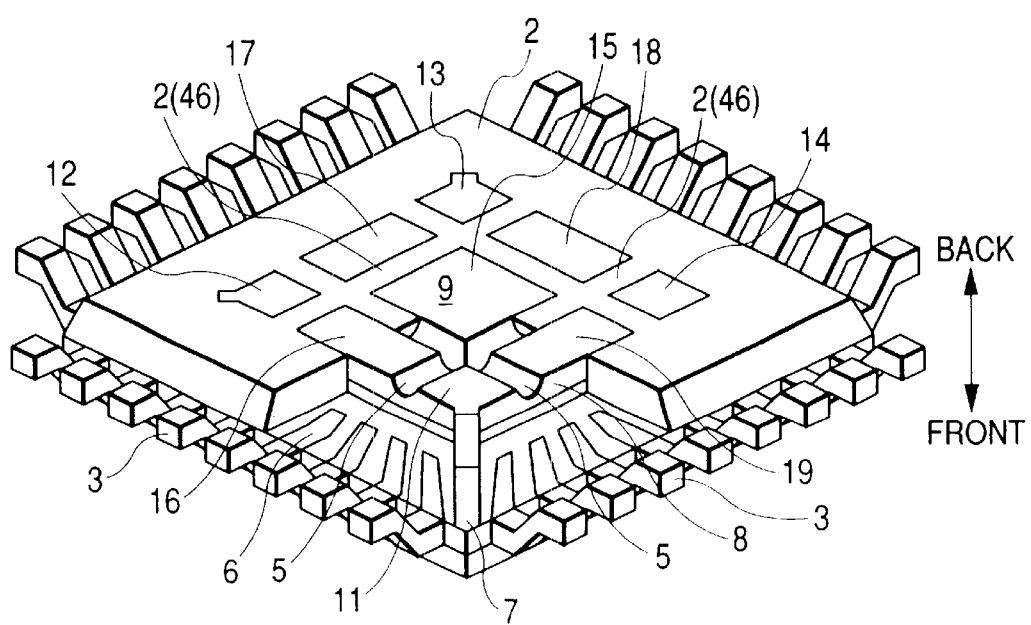
FIG. 2 is a partly broken perspective view of the resin encapsulated semiconductor device shown in FIG. 1, whose front and back are upside down.
Figure 3:
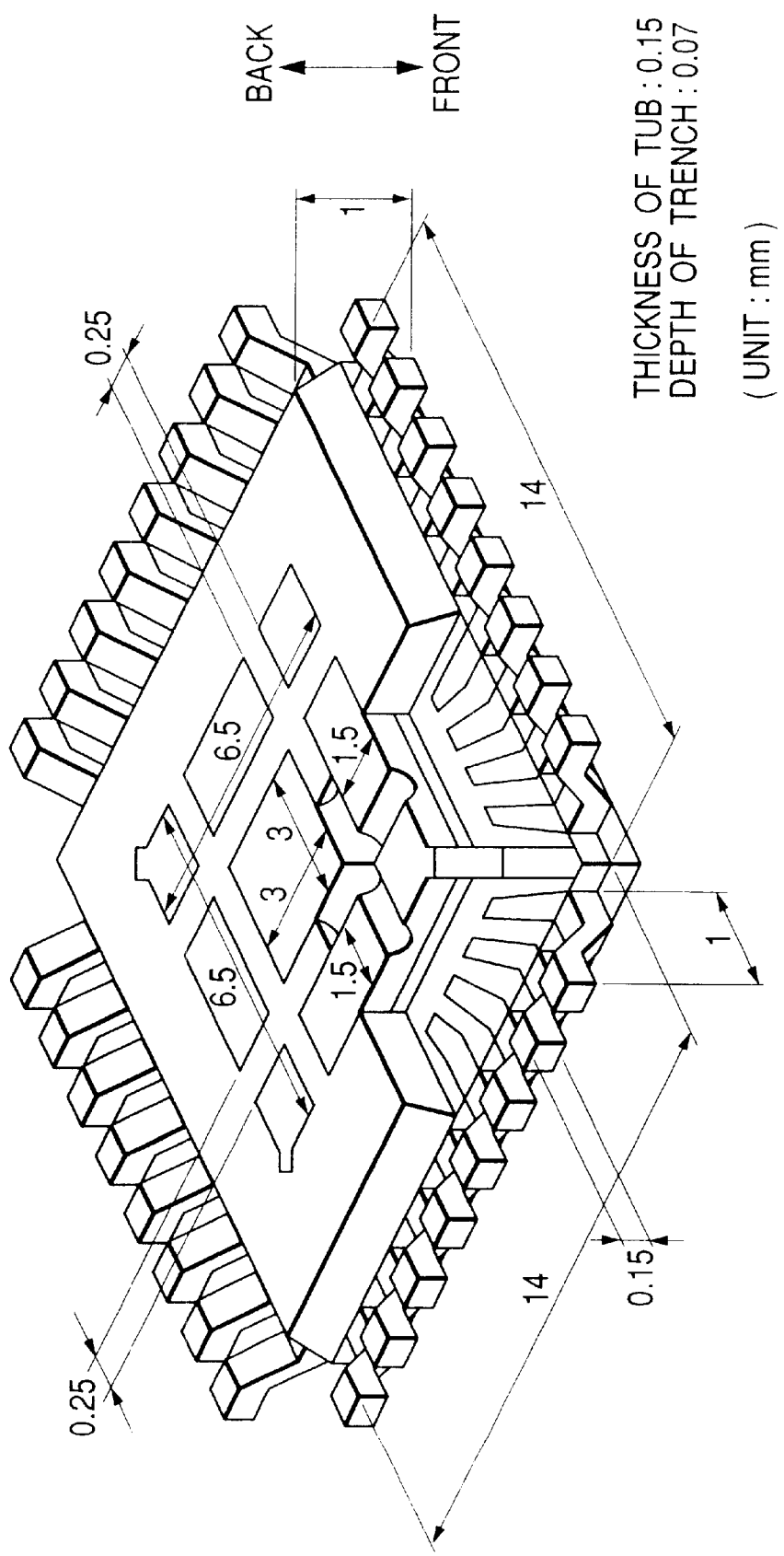
FIG. 3 is a partly broken perspective view showing dimensions of respective parts of the resin encapsulated semiconductor device shown in FIG. 2.
Figure 8A:
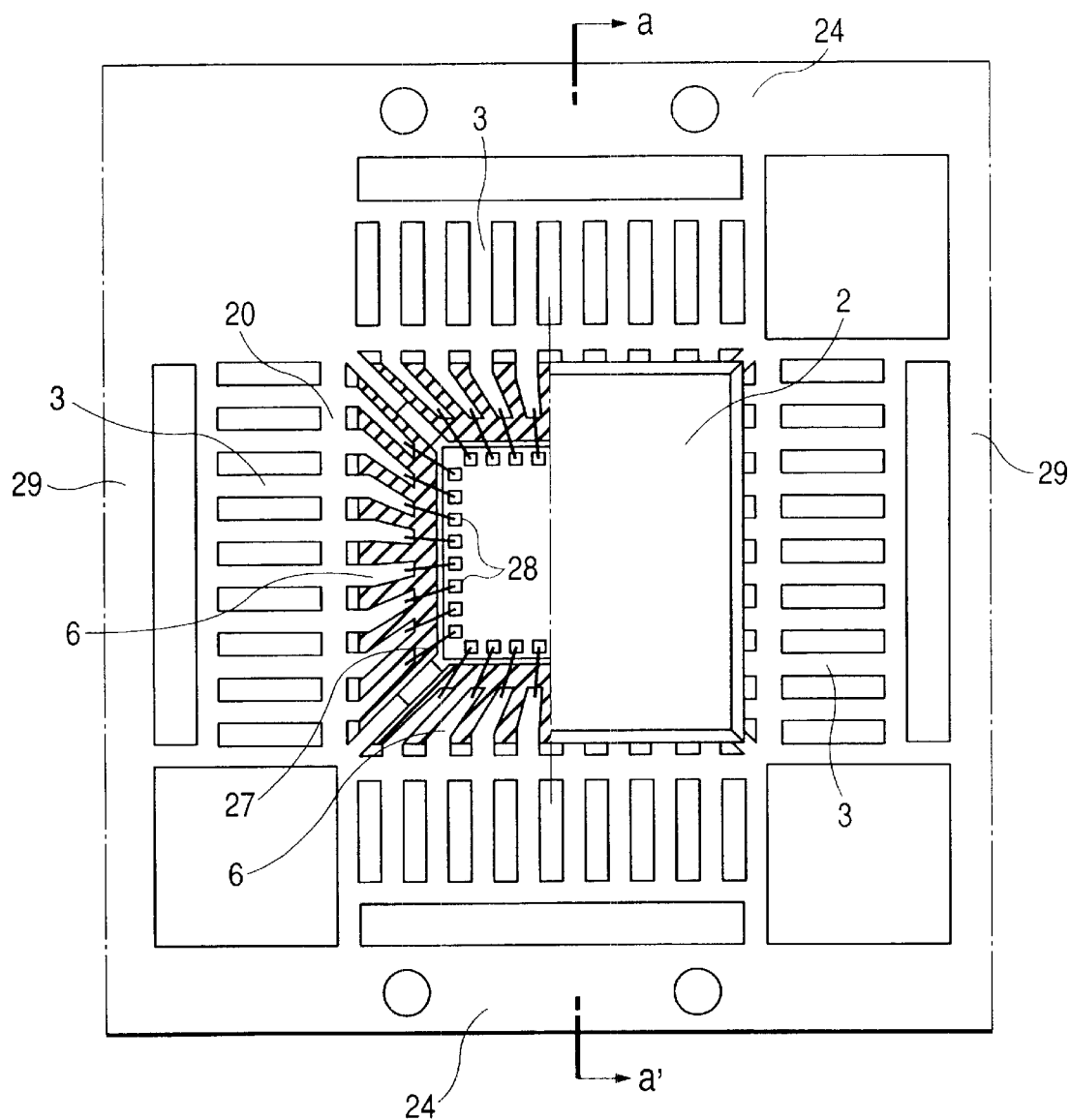
FIG. 8(a) is a partly broken plan view and FIG. 8(b) is a cross-sectional view taken along line a–a' of FIG. 8(a)
Figure 8B:
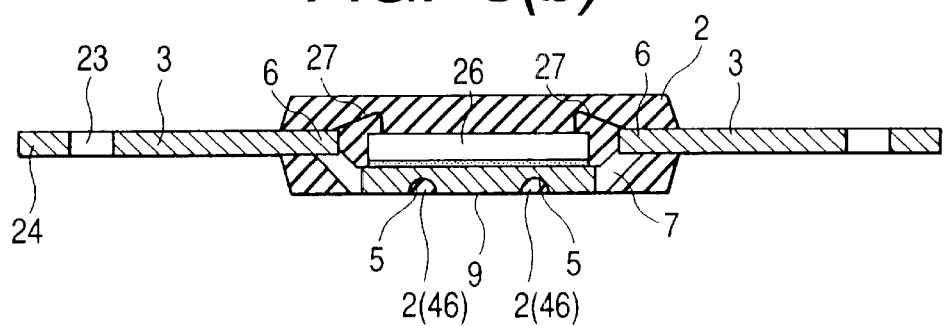
Figure 9:
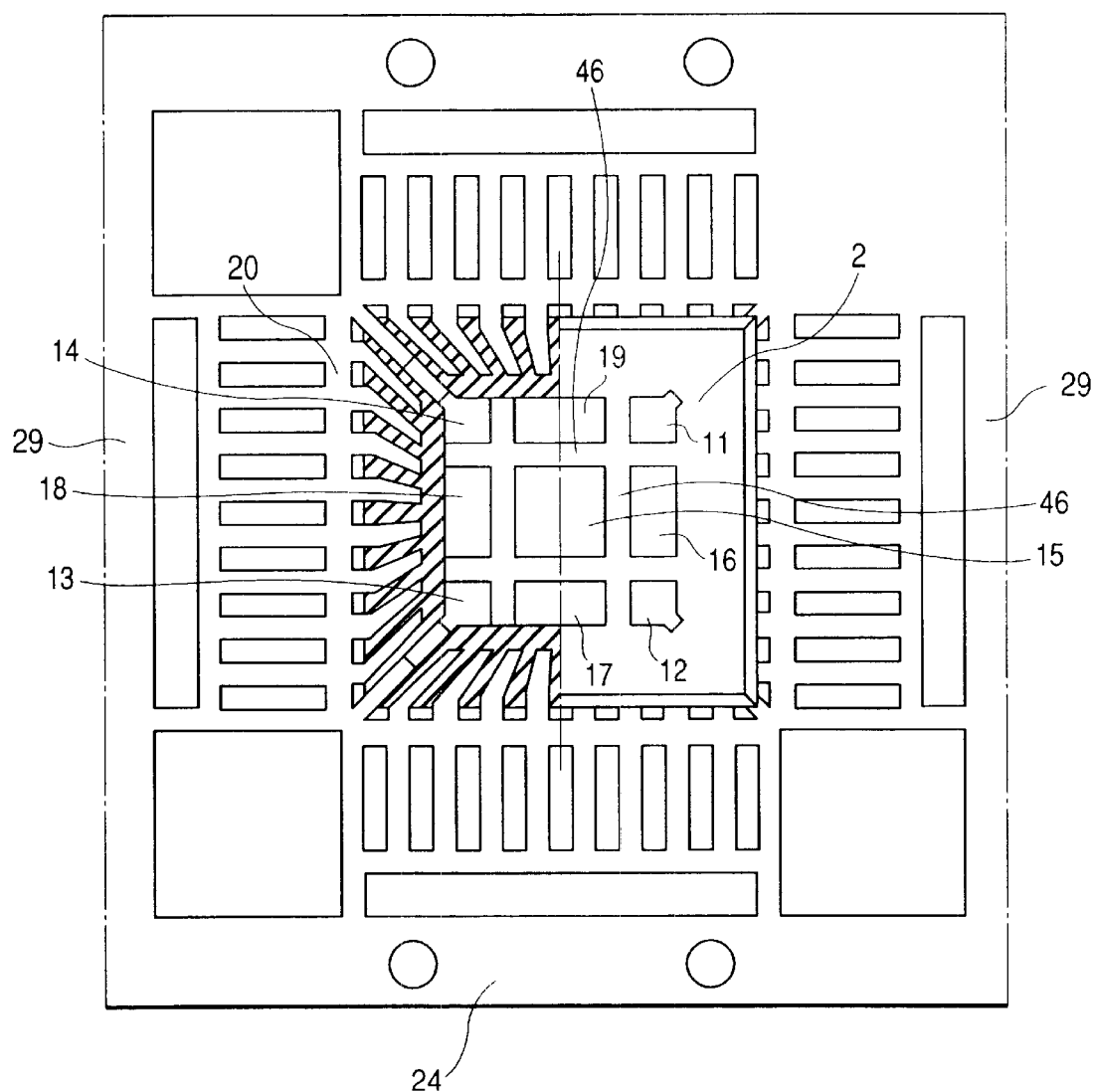
FIG. 9 is a plan view of the resin-encapsulated unit lead frame shown in FIG. 8 as seen from the back thereof.
Figure 10:
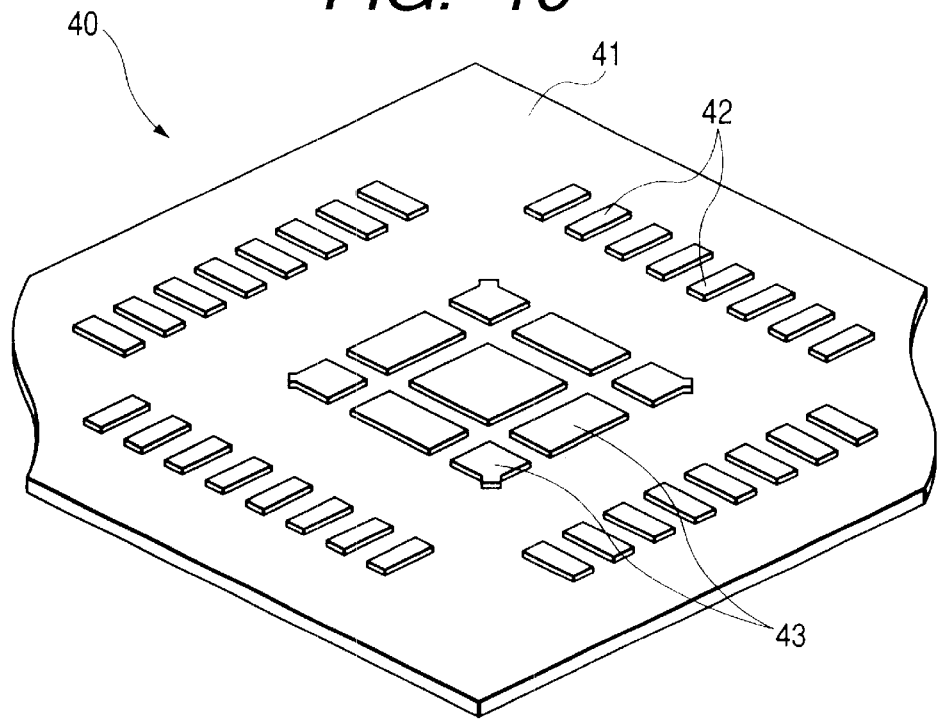
FIG. 10 is a perspective view showing a printed circuit board on which the resin encapsulated semiconductor device shown in FIGS. 1 and 2 is mounted.

FIG. 1 is a perspective view showing a resin encapsulated semiconductor device according to a first Embodiment of the present invention, FIG. 2 is a partly broken perspective view of the resin encapsulated semiconductor device shown in FIG. 1, whose front and back are upside down, FIG. 3 is a partly broken perspective view showing dimensions of respective parts of the resin encapsulated semiconductor device shown in FIG. 2, FIGS. 4 through 9 are respectively process-by-process plan views and sectional views showing a manufacturing process for the resin encapsulated semiconductor device, FIG. 10 is a perspective view showing a printed circuit board on which the resin encapsulated semiconductor device shown in FIGS. 1 and 2 is mounted, and FIG. 11 is a plan view and sectional views illustrating a mount structure in which the resin encapsulated semiconductor device shown in FIGS. 1 and 2 is mounted on the printed circuit board, respectively.

A configuration of the resin encapsulated semiconductor device according to the present first embodiment will first be explained with reference to FIGS. 1 and 2. The present first embodiment is an example indicating the application of the present invention to a resin encapsulated semiconductor device called QFP (Quad Flat Package).

The resin encapsulated semiconductor device 1 shown in FIGS. 1 and 2 comprises a quadrangular resin encapsulater 2, a plurality of outer leads 3 which respectively protrude from the four sides of the resin encapsulater 2, a plurality of inner leads 6 encapsulated in the resin encapsulater 2, tub suspension or sling leads 7, and a tub 8. The tub 8 corresponds to a semiconductor chip mounting or loading portion whose main surface (loaded surface) is equipped with a semiconductor chip. The outer leads 3 are respectively shaped in gull-wing form.

The other main surface (unloaded surface) 9 provided on the side opposite to the main surface of the tub 8 is separated into plural form by a resin 46 (resin encapsulater 2) embedded in trenches 5 as shown in FIG. 2. They constitute exposed regions 11, 12, 13, 14, 15, 16, 17, 18 and 19 exposed from the resin encapsulater 2. Of these exposed regions, those designated at numerals 11, 12, 13 and 14 are respectively located at the four corners of the other main surface (unloaded surface) 9 of the tub. The exposed region 15 is located substantially in the center of the other main surface (unloaded surface) 9 of the tub. Further, the exposed regions 16, 17, 18 and 19 exist in their corresponding positions along the four sides of the other main surface (unloaded surface) 9 of the tub.

Owing to the separation of the other main surface (unloaded surface) 9 of the tub into the plurality of exposed regions in this way, the plurality of exposed regions serve as brazing filler metal (solder) connecting portions when the resin encapsulated semiconductor device is mounted on a printed circuit board by a brazing filler metal such as solder. Further, the area of each of the plurality of exposed regions is smaller than that of the tub serving as the semiconductor chip loading portion. Therefore, the molten solder used as the brazing filler metal is not one-sided or unbalanced, so that satisfactory mounting can be carried out.

FIG. 3 is a view showing dimensions of respective parts of the resin encapsulated semiconductor device according to the first embodiment shown in FIG. 2. Reference numerals corresponding to the same points or portions as those shown in FIG. 2 are omitted. As is understood from FIG. 3, the thickness of the resin encapsulater 2 is 1.0 mm, the length thereof is 14 mm, the width thereof is 14 mm, the thickness of each outer lead 3 is 0.15 mm, the thickness of the tub 8 is 0.15 mm, and the sizes of the tub 8 are 6.5 mm in length and 6.5 mm in width.

The forms and dimensions of the exposed regions 11, 12, 13, 14, 15, 16, 17, 18 and 19 of the other main surface 9 of the tub are as follows: The exposed regions 16, 17, 18 and 19 respectively have rectangles which are 3 mm in length and 1.5 mm in width. The exposed region 15 has a quadrangle having a length of 3 mm and a width of 3 mm. Further, the exposed regions 11, 12, 13 and 14 are also respectively shaped in a form having a length of 3 mm and a width of 3 mm and respectively have protrusions which extends toward the four corners of the resin encapsulater 2. Further, the interval (i.e., the width of each trench 5) between the respective adjacent exposed regions is 0.25 mm and the depth of the trench 5 is 0.07 mm.

A method of manufacturing the resin encapsulated semiconductor device constructed as described above will next be explained.

The details of the configuration of the above-described resin encapsulated semiconductor device will also be clarified together from this description.

Figure 4A:
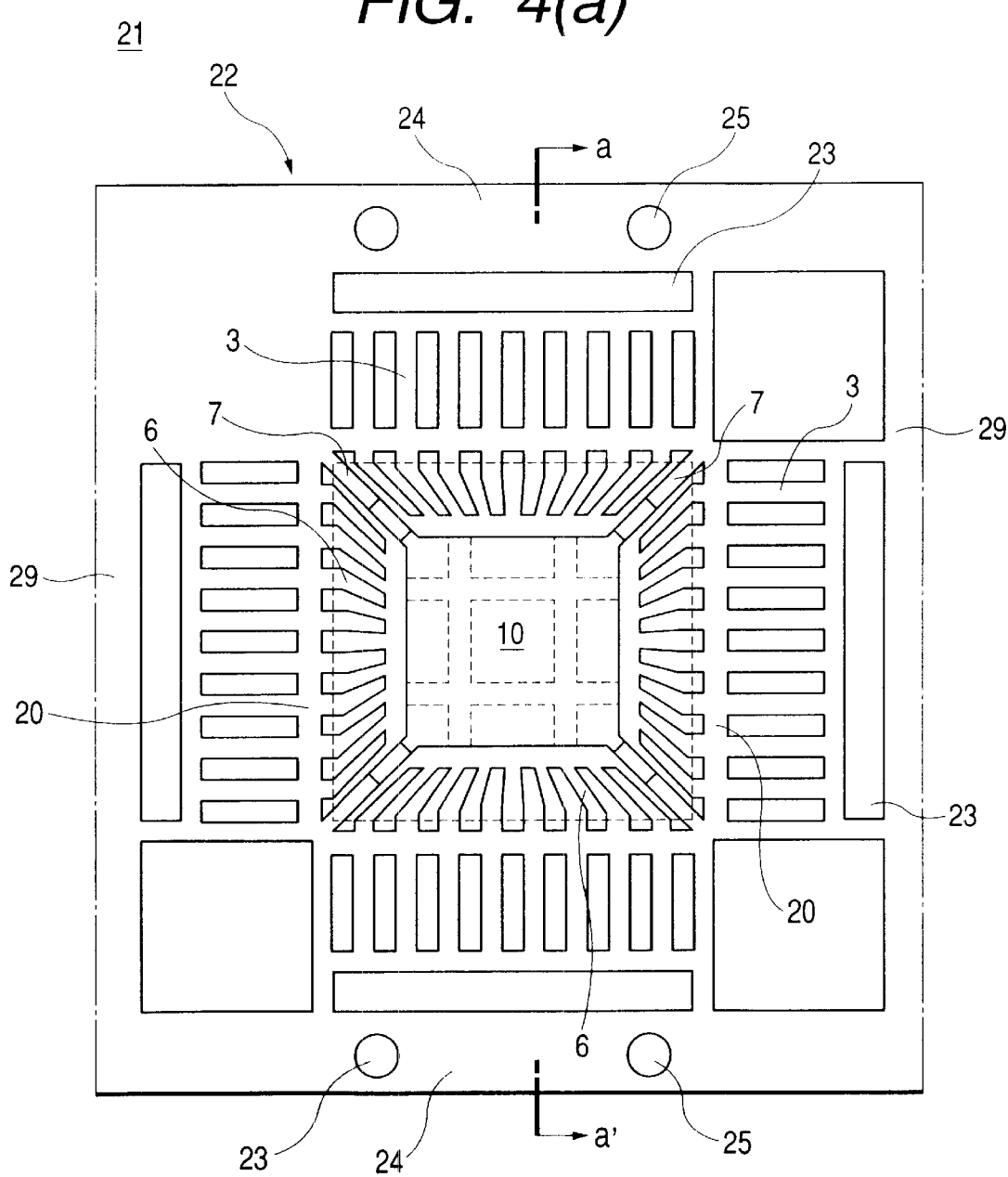
FIG. 4(a) is a plan view thereof and FIG. 4(b) is a cross-sectional view of FIG. 4(a)
Figure 4B:
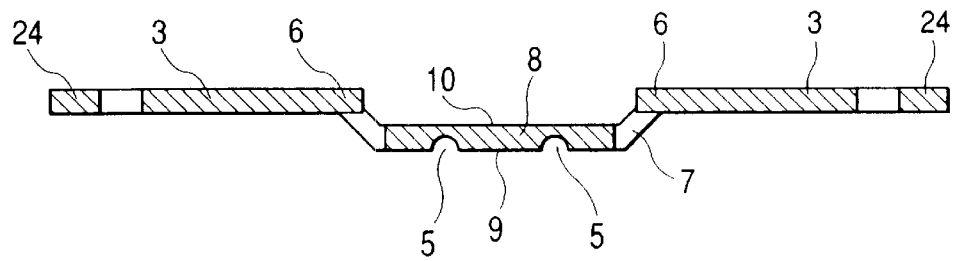

FIG. 4(a) is a plan view of a unit lead frame 22, and FIG. 4(b) is a cross-sectional view cut along line a–a' of FIG. 4(a), respectively. A multiple lead frame in which such unit lead frames 22 as shown in FIGS. 4(a) and 4(b) are formed continuously, is first prepared. A thin plate comprised of a conductive material having a relatively large mechanical strength, such as an iron-nickel alloy such as a 42-alloy, copper or the like is used for the multiple lead frame 21. The multiple lead frame 21 is formed by punching press working or etching machining. A plating film (not shown) using silver or the like is partly or entirely over the surface of the multiple lead frame 21 so that wiring bonding is properly effected thereon. The multiple lead frame 21 is formed by aligning a plurality of the unit lead frames 22 in a row in one direction. However, only a unitary lead frame 22 is illustrated for convenience's sake.

The unit lead frame 22 has a pair of outer frames 24 having positioning holes 25 defined therein. The pair of outer frames 24 is formed in parallel with a predetermined interval defined therebetween.

Inner frames 29, which are parallel to one another and provided with a predetermined interval defined therebetween, are formed between both the outer frames 24 and 24. The unit lead frame 22 is comprised of these outer frames 24 and inner frames 29 and respective elements formed within a frame body formed by these both frames.

A quadrangular tub 8 for loading or placing a semiconductor chip thereon is formed in the center of the unit lead frame 22. The tub 8 is supported by the outer frames 24 and inner frames 29 through the use of four tub sling leads 7 respectively connected to the four corners of the tub 8. As will be described in the subsequent process, the semiconductor chip is loaded on a main surface (loaded surface) 10 of the tub 8. Trenches 5 are defined in the other main surface (unloaded surface) 9 provided on the side opposite to the main surface 10 of the tub 8. A plurality of inner leads 6 located among the respective four tub sling leads 7 are placed around the tub 8. The plurality of inner leads 6 are respectively integral with outer leads 3. The upper surfaces of the inner leads 6 are respectively positioned above the main surface 10 of the tub as shown in the same figure (b). Further, the other main surface (unloaded surface) 9 on the side opposite to the main surface 10 of the tub 8 is located below the lower surfaces of the inner leads 6.

Figure 5:
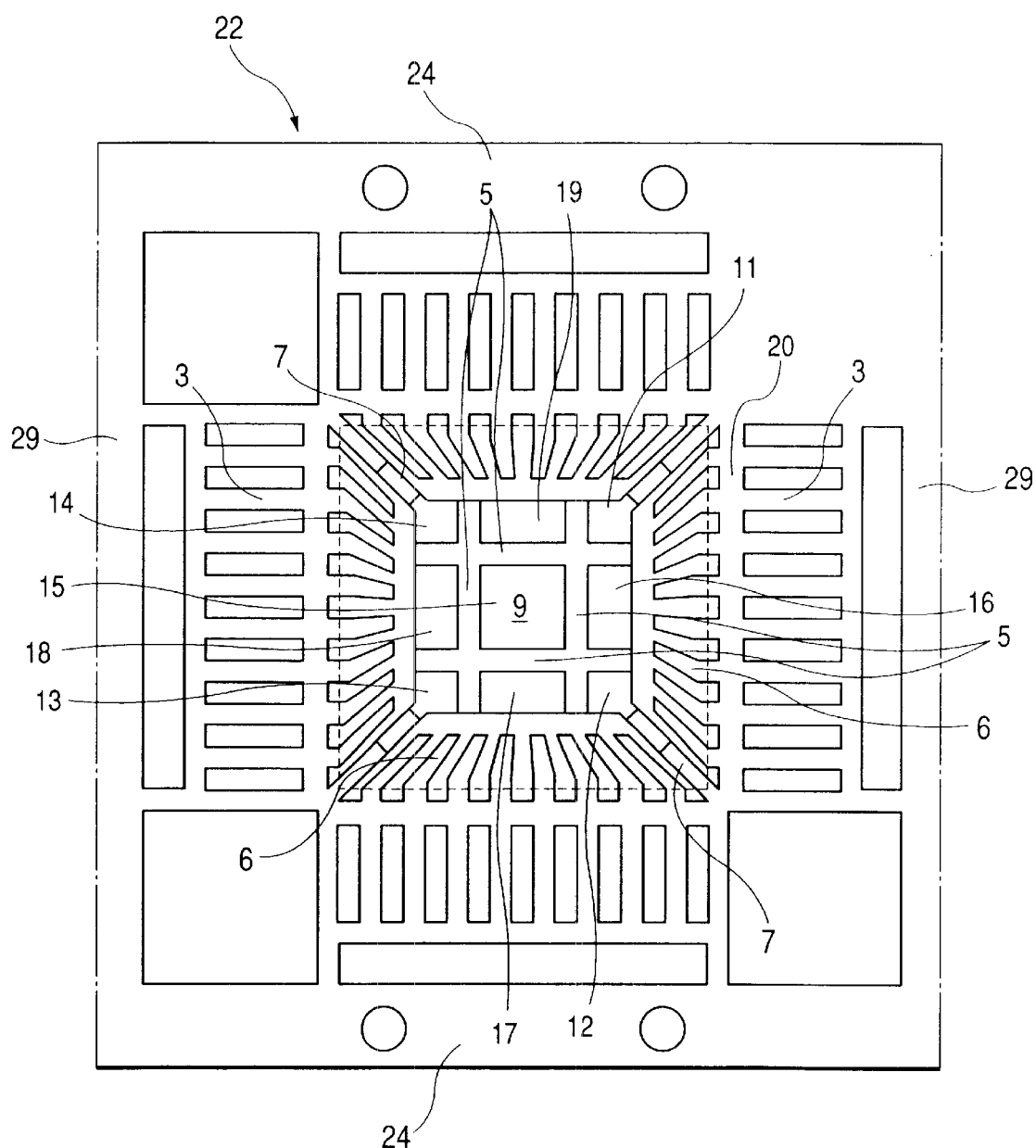
FIG. 5 is a plan view of the unit lead frame shown in FIG. 4, as seen from the reverse side thereof.

FIG. 5 is a plan view of the unit lead frame 22 shown in FIG. 4, whose front and back are reversed, i.e., a plan view of the unit lead frame 22 as shown in FIG. 4(a), as seen from the reverse side thereof. As shown in FIG. 5, trenches 5 continuous in lattice form are defined in the other main surface 9 of the tub 8. The trenches 5 are defined in the other main surface (non-loaded surface) 9 of the tub 8 so as to reach the four sides of the tub 8, i.e., to be exposed to or bared in the four sides thereof. Further, the exposed regions 11 through 19 in which the trenches 5 are not defined, serve as a plurality of exposed regions from a resin encapsulater. Of these regions 11 through 19, those designated at numerals 11, 12, 13 and 14 are located at their corresponding four corners of the tub back 9, and the region 15 is positioned substantially in the center of the tub back 9. Further, the regions 16, 17, 18 and 19 are disposed along the four sides of the tub back 9.

Figure 6A:
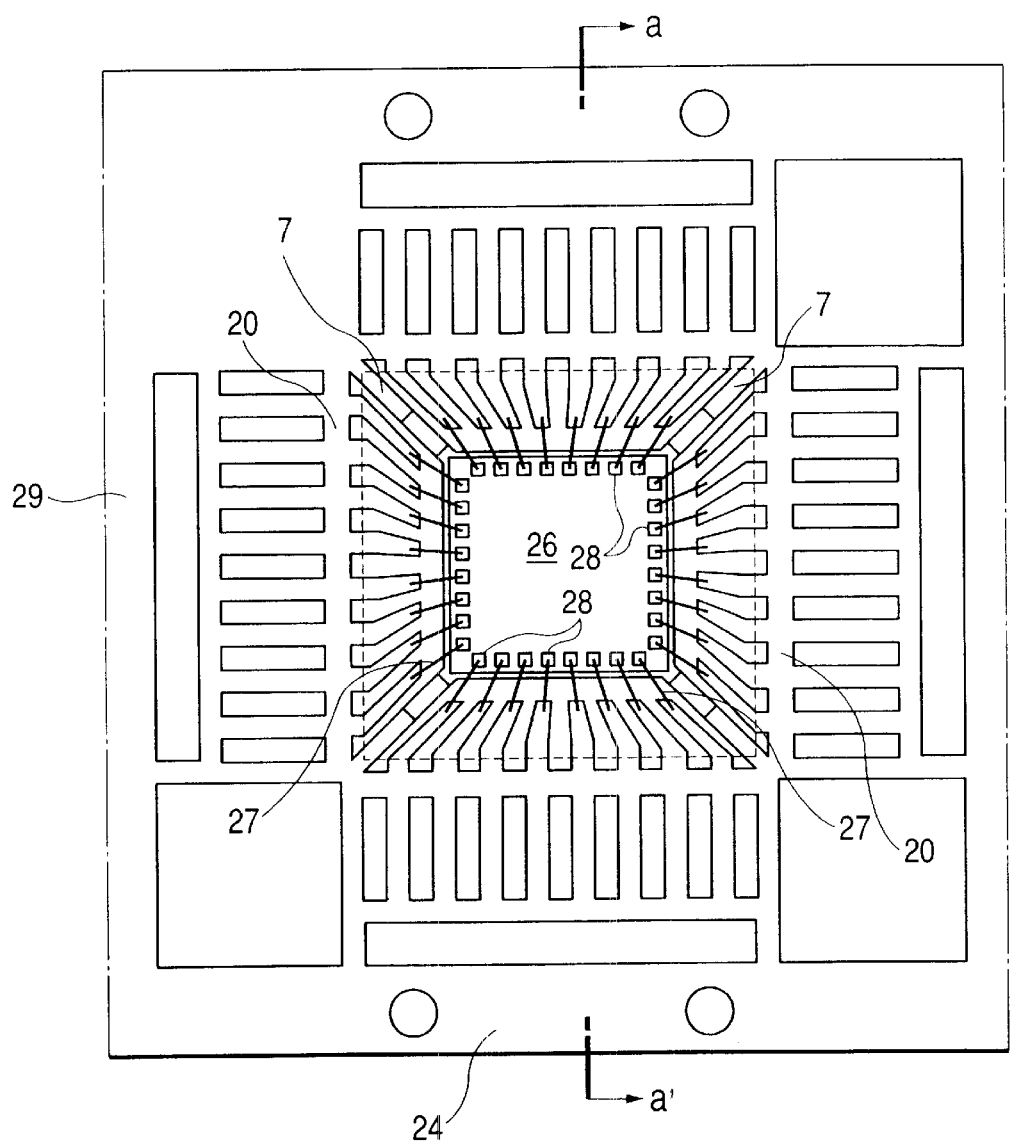
FIG. 6(a) is a plan view thereof and FIG. 6(b) is a cross-sectional view taken along line a–a' of FIG. 6(a)
Figure 6B:
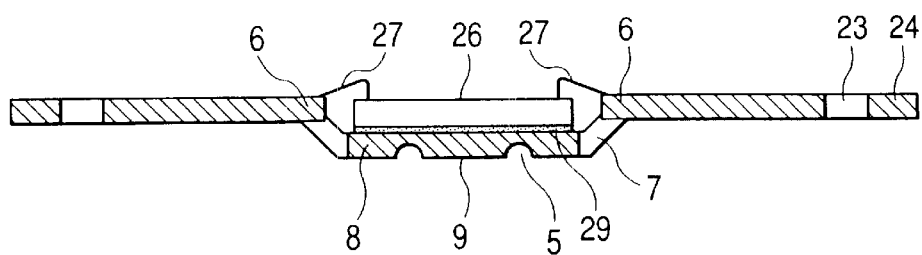

Next, a semiconductor chip 26 is adhered or bonded to the main surface 10 of the tub 8 as shown in FIGS. 6(a) and 6(b). Thereafter, a plurality of electrodes 28 and a plurality of inner leads 6 formed on one main surface of the semiconductor chip 26 are connected to one another by bonding wires 27. FIG. 6(a) is a plan view of the unit lead frame to which the semiconductor chip has been adhered and the wires have been bonded, and FIG. 6(b) is a cross-sectional view cut along line a–a' of FIG. 6(a).

Figure 7:
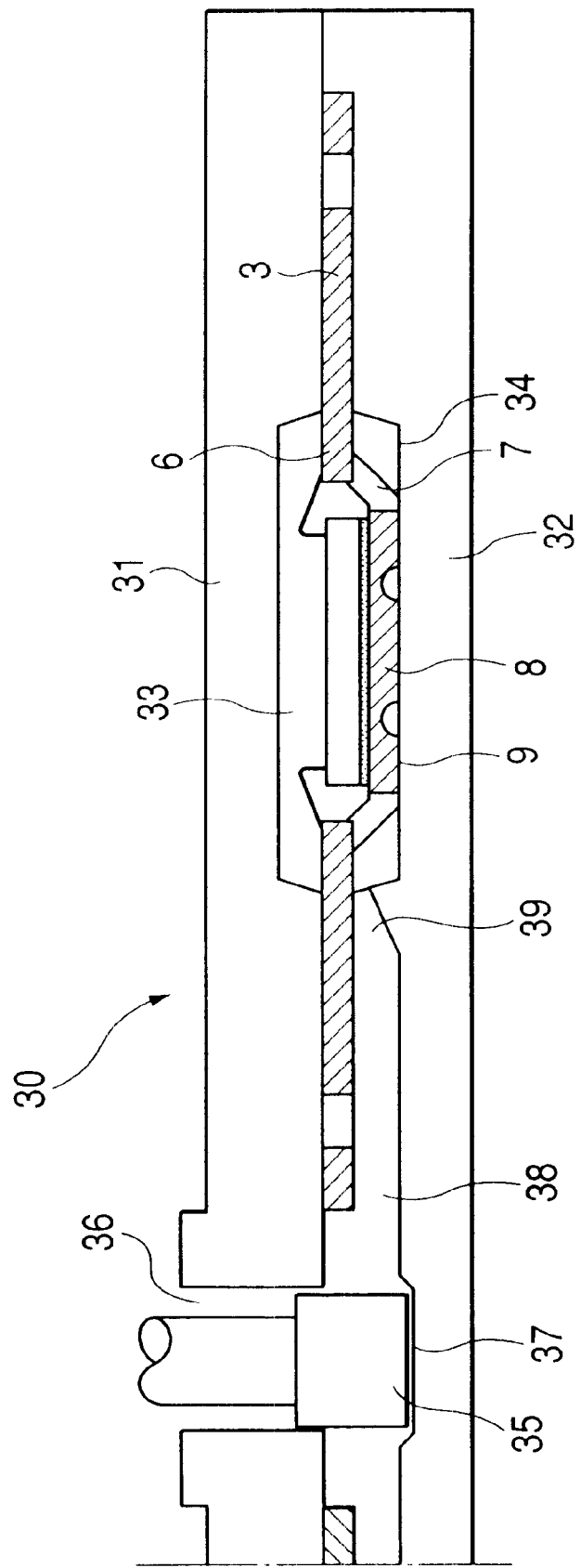
FIG. 7 is a cross-sectional view illustrating a state in which the lead frame equipped with the semiconductor chip shown in FIG. 6 is placed in a mold.

Next, a lead frame 21 equipped with the semiconductor chip 26 shown in FIG. 6 is placed in a mold 30 comprised of an upper mold 31 and a lower mold 32 as shown in FIG. 7. The mold 30 has a cavity 33 defined by recesses or concave portions respectively included in the upper mold 31 and lower mold 32. The inner leads 6, tub sling leads 7 and tub 8 of the lead frame 21 are placed within the cavity 33, and the outer leads 3 are provided so as to be interposed between the upper mold 31 and the lower mold 32 other than those for the cavity 33. At this time, the other main surface (unloaded surface) 9 on the side opposite to the main surface 10 of the tub 8 is provided so as to make contact with a cavity surface 34. Further, a gate 39 is provided so as to be located in a position along the direction in which each tub sling lead 7 extends.

A resin is charged into the cavity 33 of the mold 30 provided with the lead frame 21 therein in this way through a runner 38 and the gate 39 by a plunger 35 provided within a pot 36. While, at this time, the other main surface (unloaded surface) 9 of the tub 8, which makes contact with the cavity surface 34, is not covered with the resin, the trenches 5 defined in the other main surface (unloaded surface) 9 of the tub 8 are filled with the resin. Since the trenches 5 are defined in the other main surface (unloaded surface) 9 of the tub 8 in continuous lattice form and formed so as to reach the sides of the tub 8, the resin is injected into the trenches from such side portions so that the trenches 5 shaped in lattice form are buried. Since the resin charged into the cavity 33 along the each tub sling lead 7 flows along the two sides interposing each corner of 24 the tub therebetween, to which each tub sling lead 7 is connected, it is easily injected into the trenches 5 defined in the sides.

Next, the lead frame 21 is taken out of the mold 30. A state of the extracted lead frame 21 is shown in FIGS. 8(a) and 8(b). The same drawings are views showing the state of the unit lead frame 22, wherein FIG. 8(a) is a partly broken plan view and FIG. 8(b) is a cross-sectional view cut along line a–a' of FIG. 8(a).

As shown in FIGS. 8(a) and 8(b), the tub 8, the semiconductor chip 26, the bonding wires 27 and the plurality of inner leads 6 are sealed with a quadrangular resin encapsulater 2. A plurality of outer leads 3 protrude from the four sides of the resin encapsulater 2 respectively. Since the resin 46 simply enters into the trenches 5 as described above, the other main surface (unloaded surface) 9 of the tub 8 is made bare from the resin encapsulater 2 except for the trenches 5 defined in the other main surface (unloaded surface) 9 of the tub 8. This exposed region is placed in a state of being separated by the trenches 5, so that a plurality of mutually-separated exposed regions are formed within the other main surface (unloaded surface) 9 of the tub 8. The resin 46 having buried the trenches 5 is the same resin as that which forms the resin encapsulater 2.

FIG. 9 is a partly broken plan view of the resin encapsulated unit lead frame 22 of FIG. 8 whose front and back are reversed, i.e., a plan view of the resin encapsulated unit lead frame 22 shown in FIG. 8(a) as seen from the reverse side thereof. As is understood from the same drawing, the other main surface (unloaded surface) 9 of the tub 8 has a plurality of exposed regions 11 through 19 kept in a state of being separated from the resin 46 embedded in the trenches 5.

Next, the outer frames 24, inner frames 29 and dam 20 of the above-described lead frame are separated from one another and a plurality of outer leads 3 are formed, whereby the resin encapsulated semiconductor device shown in FIGS. 1 and 2 is formed.

FIG. 10 shows a printed circuit board 40 for mounting the resin encapsulated semiconductor device shown in FIGS. 1 and 2 thereon. In the printed circuit board 40, a plurality of lands 42 and lands 43 corresponding to metal connecting terminals are formed over the surface of an insulating substrate 41 comprised of an insulating material such as glass epoxy or the like. The plurality of outer leads 3 of the resin encapsulated semiconductor device shown in FIGS. 1 and 2 are respectively electrically connected to the plurality of lands 42. Further, the plurality of exposed regions 11 through 19 bared in the other main surface (unloaded surface) 9 of the tub 8 of the resin encapsulated semiconductor device shown in FIGS. 1 and 2 are respectively electrically connected to the plurality of lands 43. Thus, the plurality of lands 43 are formed in the same patterns as those for the plurality of exposed regions 11 through 19 bared in the other main surface (unloaded surface) 9 of the tub 8.

Figure 11A:
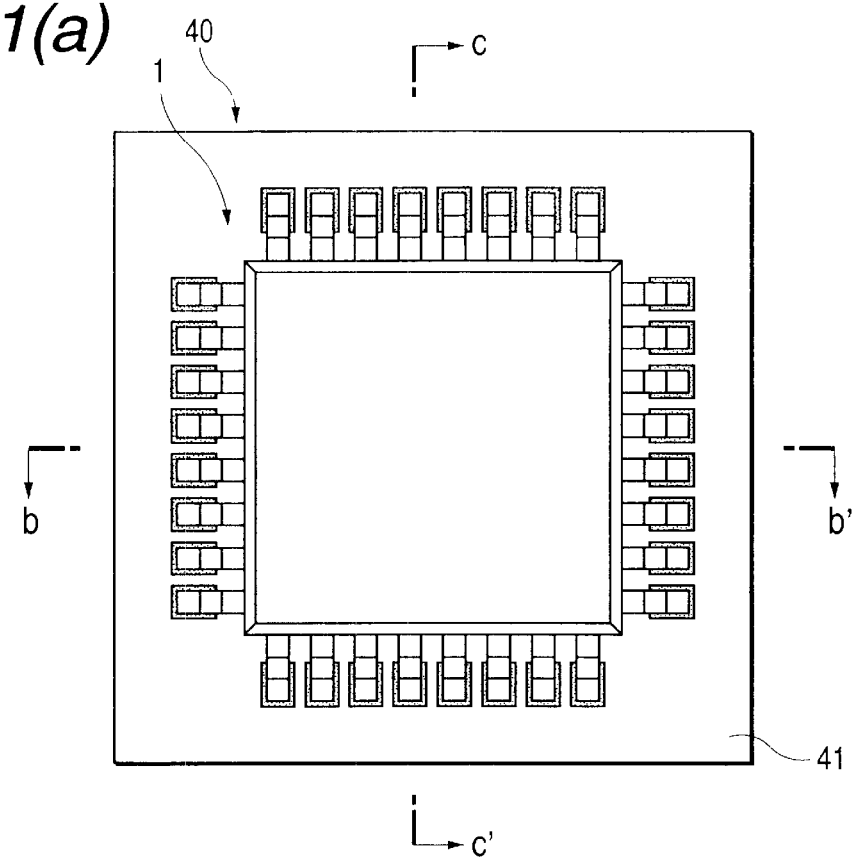
FIG. 11(a) is a plan view and FIGS. 11(b) and 11(c) are respectively cross-sectional views taken along lines b–b' and c–c' of FIG. 11(a)
Figure 11B:
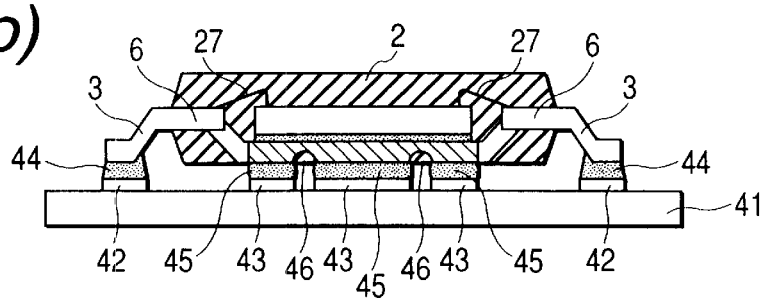
Figure 11C:
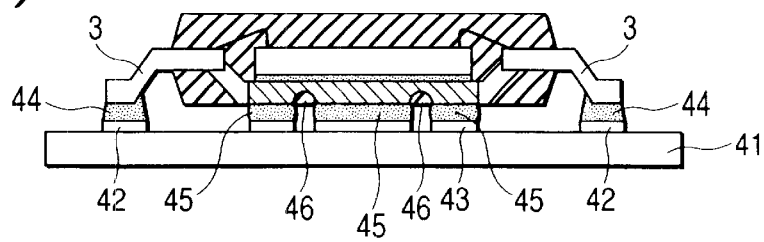

FIGS. 11(a), 11(b) and 11(c) respectively show a state in which the resin encapsulated semiconductor device shown in FIGS. 1 and 2 is implemented on a printed circuit board 40. FIG. 11(a) is a plan view, and FIGS. 11(b) and 11(c) are respectively cross-sectional views cut along lines b–b' and c–c' of FIG. 11(a). As shown in the same drawing, a plurality of outer leads 3 of a resin encapsulater, and exposed regions 11 through 19 on the other main surface (unloaded surface) 9 of a tub 8 are respectively electrically connected to a plurality of lands 42 and a plurality of lands 43 by brazing filler metals (solder) 44 and 45. Since a resin 46 embedded in trenches 5 is a substance which is hard to be wet with the brazing filler metal 45, as shown in the same figures (b) and (c), the solder 45 is not wet to and spread over those other than the exposed regions 11 through 19 on the other main surface (unloaded surface) 9 of the tub 8. Since the respective areas of the exposed regions 11 through 19 are smaller than the entire area of the other main surface (unloaded surface) 9 of the tub 8, the amount of the brazing filler metal (solder) with which the plurality of lands 43 are respectively filled, may be reduced. Accordingly, the brazing filler metal (molten solder) melted below the semiconductor chip loading portion as in the prior art is not biased or unbalanced and hence the mounting of the resin encapsulated semiconductor device onto the printed circuit board can be carried out satisfactorily and reliably.

When a post-mounting repair is taken into consideration, the application of the brazing filler metal (solder) to the exposed regions 11 through 19 on the back of the resin encapsulated semiconductor device 1 is carried out such that only the exposed regions 11 through 14 and 16 through 19 excluding the exposed region 15 of these exposed regions and their corresponding lands 43 are connected to one another by the brazing filler metal (solder). When they are connected in this way, the resin encapsulated semiconductor device 1 can be easily taken off from the printed circuit board 40 even if the heat, which melts the brazing filler metal (solder), does not sufficiently reach the exposed region 15 and its corresponding lands 43 upon repair.

According to the embodiment described above, the following advantageous effects can be obtained.

(1) Since the brazing filler metal (solder) is not made one-sided between the tub back corresponding to the semiconductor chip loading portion and each land on the printed circuit board, it is possible to satisfactorily mount the resin encapsulated semiconductor device onto the printed circuit board.

(2) The brazing filler metal (solder) is applied only to the peripheral exposed regions easy to transfer heat except for the central region of the plurality of exposed regions on the tub back, whereby the dismounting of the resin encapsulated semiconductor device from the printed circuit board becomes easy upon repair so that the repair is facilitated.

(3) Since the trenches defined in the tub back are shaped in continuous lattice form and formed so as to be bare in the tub sides, the resin, which flows along the tub sling leads and flows along the tub sides, can be easily injected into the trenches, and the trenches shaped in lattice form can be buried by the resin.

Second Embodiment

Figure 12:
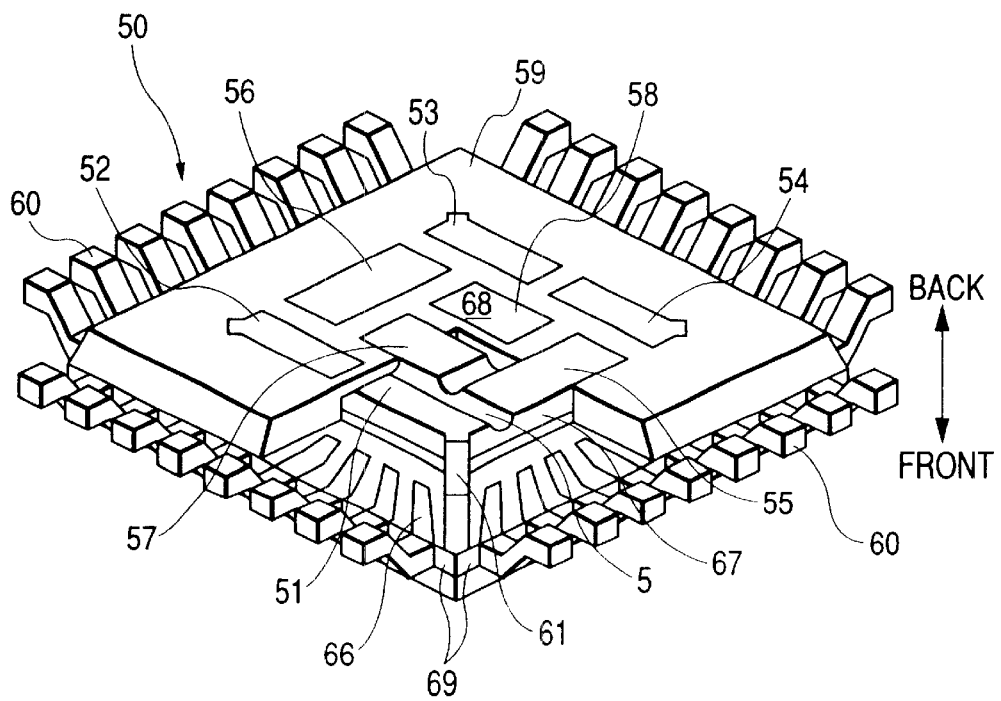
FIG. 12 is a partly broken perspective view of a resin encapsulated semiconductor device according to a second embodiment of the present invention, whose front and back are upside down.
Figure 13:
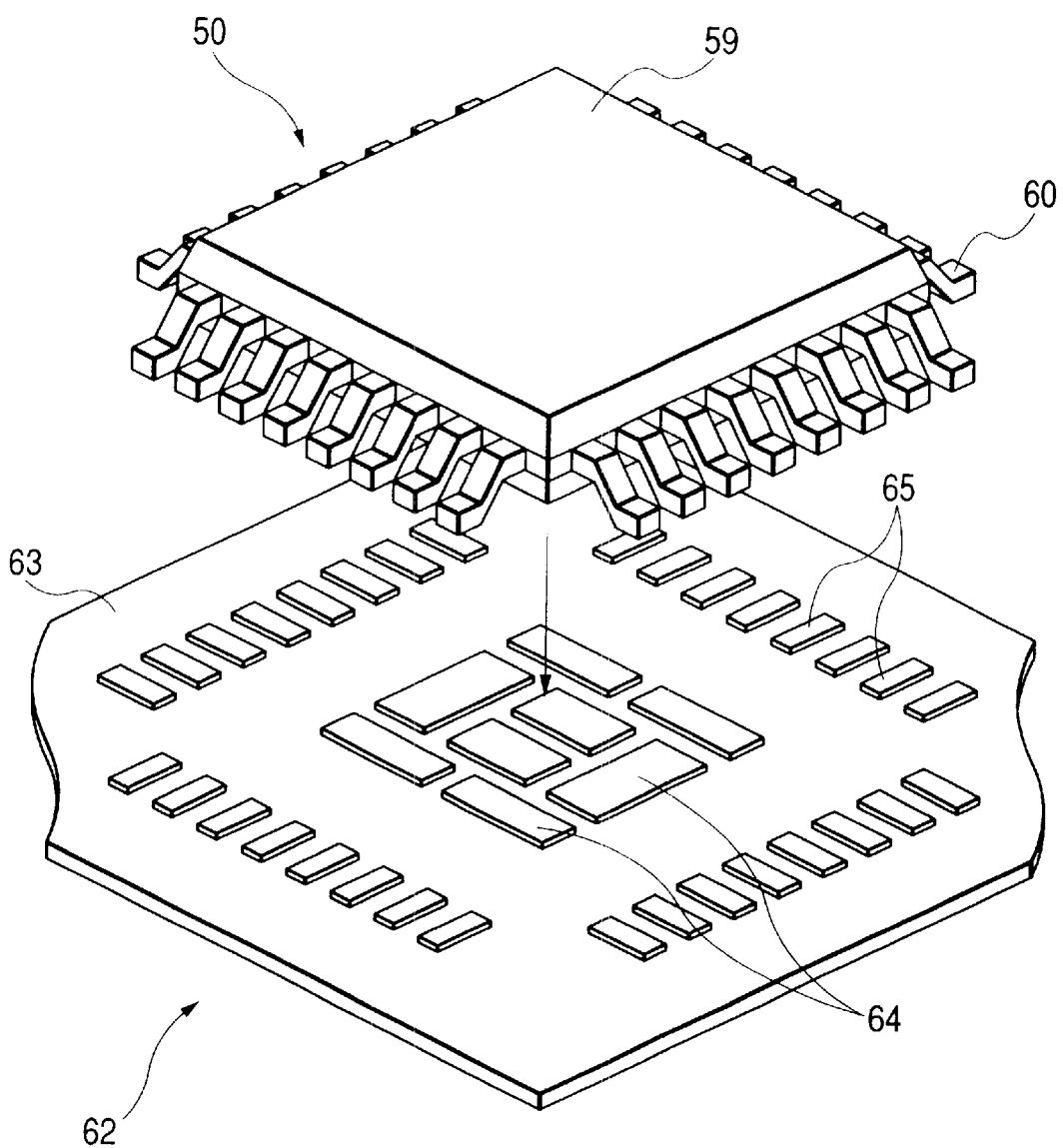
FIG. 13 is a perspective view illustrating the resin encapsulated semiconductor device shown in FIG. 12 and a printed circuit board on which the resin encapsulated semiconductor device is to be implemented.

FIG. 12 is a partly broken perspective view of a resin encapsulated semiconductor device according to a second embodiment of the present invention, whose front and back are upside down, and FIG. 13 is a perspective view illustrating the resin encapsulated semiconductor device and a printed circuit board on which the resin encapsulated semiconductor device is to be mounted.

The resin encapsulated semiconductor device 50 shown in FIG. 12 is an example illustrative of a case in which the present invention is applied to a resin encapsulated semiconductor device called "QFP (Quad Flat Package)" similar to the first embodiment.

The resin encapsulated semiconductor device 50 comprises a quadrangular resin encapsulater 59, a plurality of outer leads 60 which project from four sides 81 of the resin encapsulater 59, a plurality of inner leads 66 encapsulated in the resin encapsulater 59, tub sling leads 61 and a tub 67. The tub 67 is a semiconductor chip loading portion. A semiconductor chip is mounted on its main surface (loaded surface).

Each outer lead 60 is bent in gull-wing form. The resin encapsulater 59 is an encapsulater whose thickness, length and width are 1.0 mm, 14 mm and 14 mm respectively. The thickness of each outer lead is 0.15 mm and the thickness of the tub 80 is 0.15 mm. Further, the main surface (loaded surface) of the tub 67 has a size which is 6.5 mm long and 6.5 mm wide.

A reverse side or back 68 of the tub 67 is separated into eight as shown in FIG. 12, which are bared or exposed from the resin encapsulater 59. As designated at numerals 51 through 58, the eight exposed regions comprises regions 51, 52, 53, 54 and 55 extending along four sides 69 of the resin encapsulater 59, and regions 57 and 58 lying in positions surrounded by these.

While the present second embodiment is different from the first embodiment in the forms and number of the plurality of exposed regions made bare from the resin encapsulater 59, an advantageous effect similar to that obtained in the first embodiment can be obtained.

FIG. 13 shows the manner in which the resin encapsulated semiconductor device 50 described above is mounted on a printed circuit board 62. Lands 64 and 65 of a printed circuit board 62 comprised of an insulating substrate 63 and the lands 64 and 65 made up of conductors formed over the surface of the insulating substrate 63, and the exposed regions 51 through 58 and outer leads 60 of the resin encapsulated semiconductor device 50 are respectively connected to one another by a brazing filler metal (solder), whereby the resin encapsulated semiconductor device 50 is mounted on the printed circuit board 62.

Third Embodiment

Figure 14:
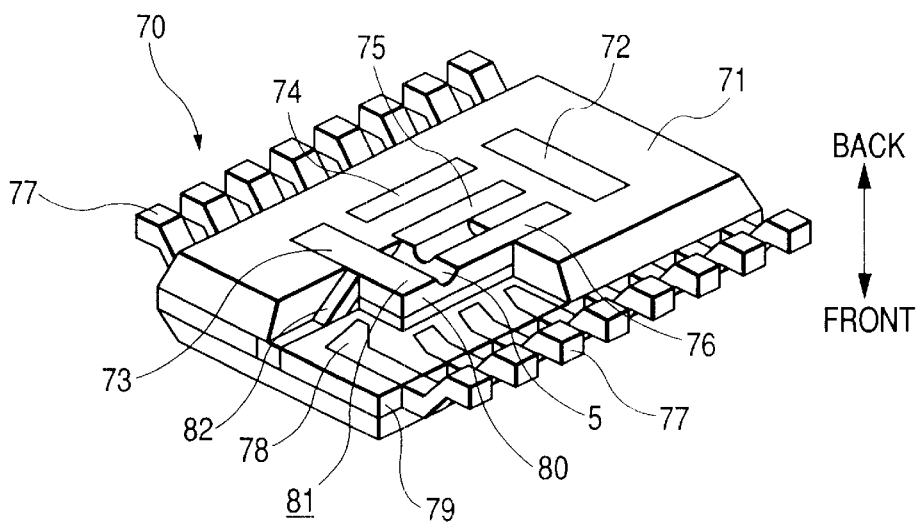
FIG. 14 is a partly broken perspective view of a resin encapsulated semiconductor device according to a third embodiment of the present invention, whose front and back are upside down.
Figure 15:
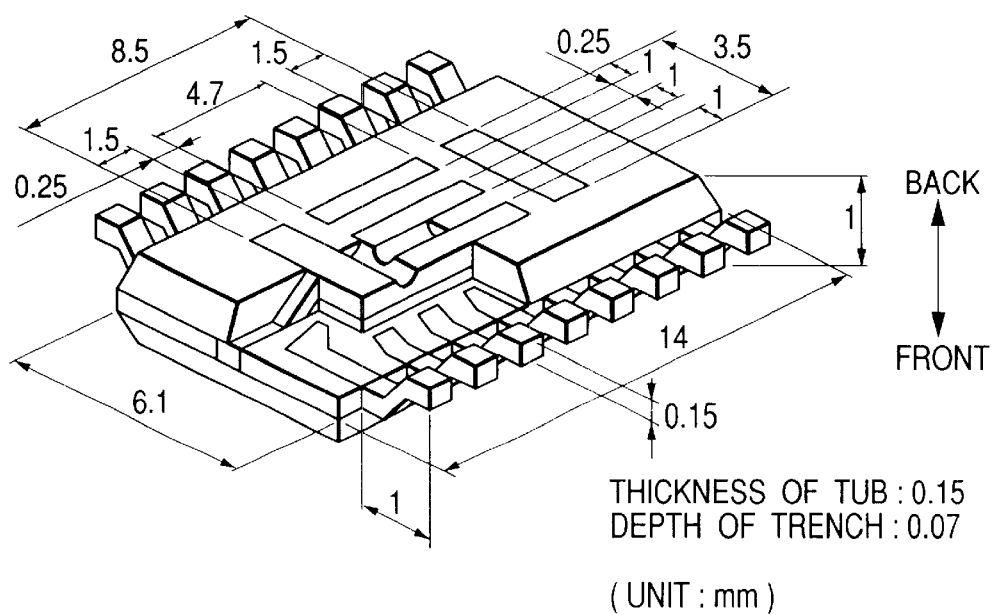
FIG. 15 is a partly broken perspective view illustrating dimensions of respective parts of the resin encapsulated semiconductor device shown in FIG. 14.

FIG. 14 is a partly broken perspective view of a resin encapsulated semiconductor device according to a third embodiment of the present invention, whose front and back are upside down, and FIG. 15 is a partly broken perspective view illustrating dimensions of respective parts of the resin encapsulated semiconductor device shown in FIG. 14, respectively.

Figure 16:
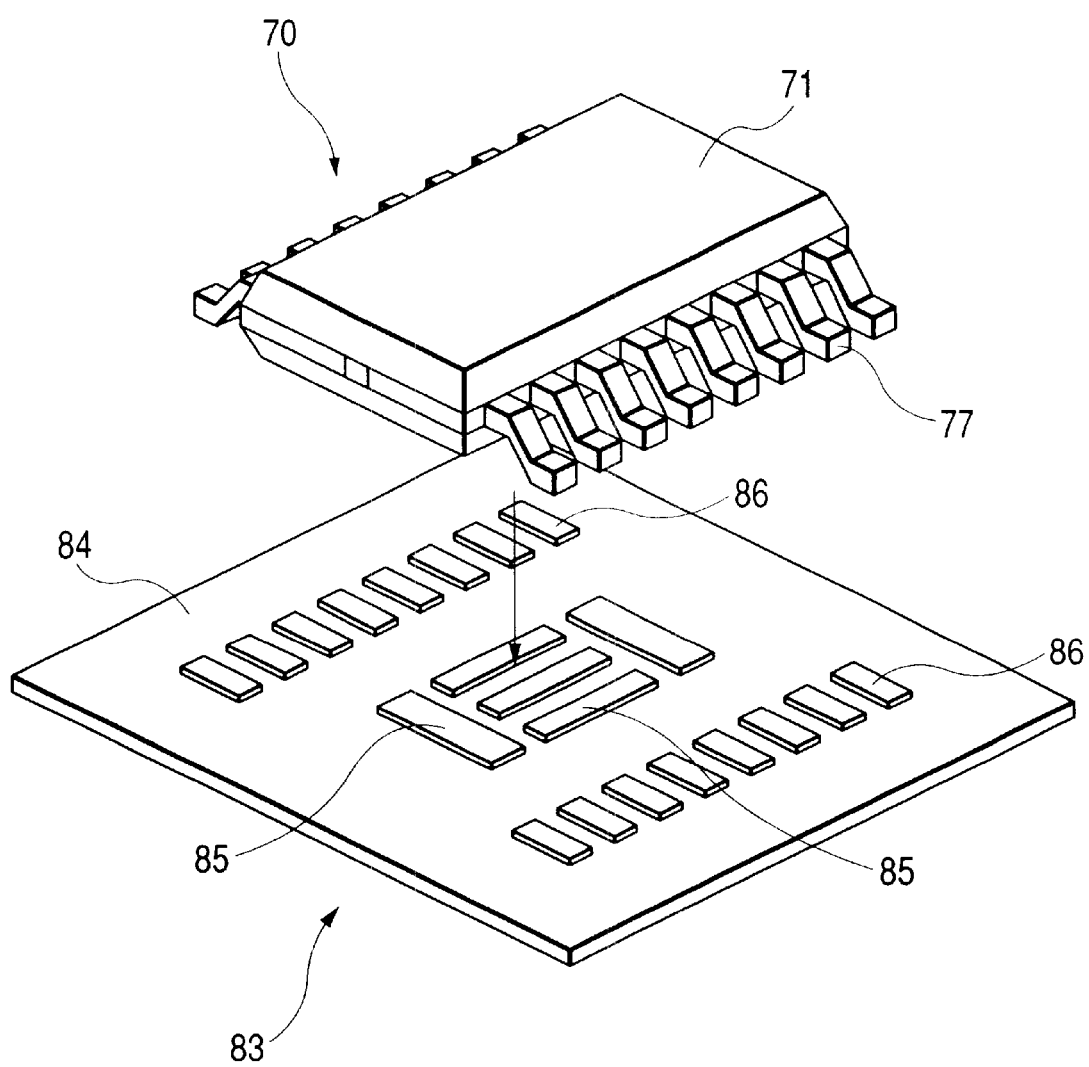
FIG. 16 is a perspective view depicting the resin encapsulated semiconductor device and a printed circuit board on which the resin encapsulated semiconductor device is to be mounted.

FIG. 16 is a perspective view depicting the resin encapsulated semiconductor device and a printed circuit board on which the resin encapsulated semiconductor device is to be mounted.

FIG. 14 is an example showing a case in which the present invention is applied to a resin encapsulated semiconductor device 70 called "SOP (Small Outline Package)".

The resin encapsulated semiconductor device 70 comprises a rectangular resin encapsulater 71 having long and short sides, a plurality of outer leads 77 which protrude from each side 79 lying on the side of the long side of the resin encapsulater 71, a plurality of inner leads 78 encapsulated in the resin encapsulater 71, tub sling leads 82 and a tub 80. The tub 80 serves as a semiconductor loading portion and has a main surface (loaded or mounted surface) on which a semiconductor chip is loaded. Each outer lead 77 is bent in gull-wing form.

As shown in FIG. 14, the other main surface (unloaded or non-mounted surface) 81 on the side opposite to the main surface of the tub 80 is separated into plural form by a resin 46 (resin encapsulater 71) embedded in trenches 5, which constitute a plurality of exposed regions 71, 73, 74, 75 and 76 made bare from the resin encapsulater 71. Of these exposed regions, the exposed regions 72 and 73 are formed along the short sides of the resin encapsulater, and the exposed regions 74, 75 and 76 are formed along the long sides of the resin encapsulater.

FIG. 15 is a view illustrating dimensions of respective parts of the resin encapsulated semiconductor device according to the third embodiment shown in FIG. 14. Reference numerals indicative of the same points or portions as those in FIG. 14 are omitted. As is understood from FIG. 15, the thickness of the resin encapsulater 71 is 1.0 mm, the length of the resin encapsulater 71 is 14 mm, and the width thereof is 6.1 mm. The thickness of the tub 80 is 0.15 mm. The main surface (loaded surface) of the tub 80 has a size which is 8.5 mm in length and 3.5 mm in width.

The forms and dimensions of the exposed regions 72, 73, 74, 75 and 76 on the other main surface 81 of the tub are as follows: Each of the exposed regions 72 and 73 is shaped in the form of a rectangle whose length and width are 3.5 mm and 1.5 mm respectively. The exposed regions 74, 75 and 76 are shaped in the form of rectangles whose lengths and widths are 4.7 mm and 1 mm, respectively. The interval (i.e., width of each trench 5) between these adjacent exposed regions is 0.25 mm and the depth of the trench 5 is 0.07 mm.

FIG. 16 shows the manner in which the resin encapsulated semiconductor device 71 is mounted on a printed circuit board 83. An insulating substrate 84 comprised of an insulator such as glass epoxy, and a printed circuit board 83 having a plurality of lands 85 and 86 made up of conductors such as a metal, which are formed over the surface of the insulating substrate 84, are prepared. The plurality of lands 85 and 86 on the printed circuit board 83, and the exposed regions 72 through 76 and outer leads 77 of the resin encapsulated semiconductor device 71 are connected to one another by a brazing filler metal (solder), whereby the resin encapsulated semiconductor device 71 is implemented on the printed circuit board 83.

The plurality of outer leads 77 of the resin encapsulated semiconductor device 70 shown in FIG. 14 are electrically connected to the plurality of lands 86. Further, the plurality of exposed regions 71 through 76 bare in the other main surface (unloaded surface) 81 of the tub 80 of the resin encapsulated semiconductor device 70 shown in FIG. 14 are electrically connected to the plurality of lands 85. Accordingly, the plurality of lands 85 are formed in the same patterns as the plurality of exposed regions 71 through 76 bare in the other main surface (unloaded surface) 81 of the tub 80.

Owing to the separation of the other main surface 107 of the tub into plural form in this way, brazing filler metal (solder) connecting portions on the other main surface 107 of the tub which serves as the semiconductor chip loading portion, result in a plurality of regions when the resin encapsulated semiconductor device is mounted on the printed circuit board by the brazing filler metal (solder). Further, the area of each of the plurality of regions is smaller than that of the tub serving as the semiconductor chip loading portion. Therefore, the molten brazing filler metal (solder) is not made one-sided or unbalanced, so that satisfactory mounting can be carried out.

Fourth Embodiment

Figure 17:
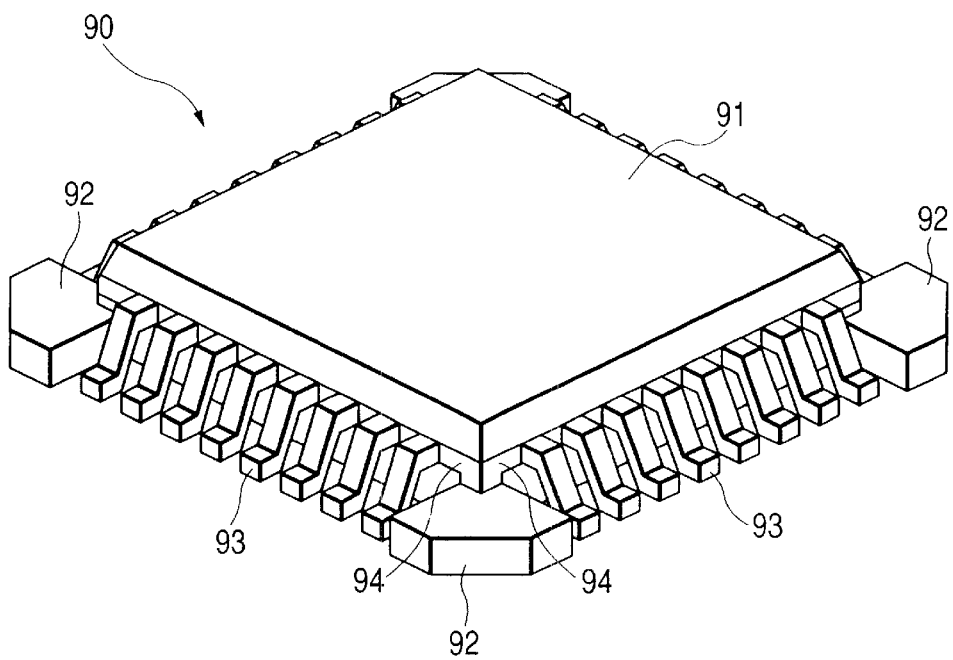
FIG. 17 is a perspective view showing a resin encapsulated semiconductor device according to a fourth embodiment of the present invention.

FIG. 17 is a perspective view showing a resin encapsulated semiconductor device according to a fourth embodiment of the present invention, and FIG. 18 is a partly broken perspective view of the resin encapsulated semiconductor device shown in FIG. 17, whose front and back are upside down, respectively.

The present fourth embodiment is an example illustrative of a case in which the present invention is applied to a resin encapsulated semiconductor device having a radiating heat sink (or header) called "HQFP (Quad Flat Package with Heat Sink)".

The resin encapsulated semiconductor device 90 shown in FIGS. 17 and 18 comprises a quadrangular resin encapsulater 91, a plurality of outer leads 93 which protrude from four sides 94 of the resin encapsulater 91 respectively, a plurality of inner leads 95 encapsulated in the resin encapsulater 91, and a heat sink (or header) 106. The heat sink 106 corresponds to a semiconductor chip loading portion and has a main surface (loaded surface) on which a semiconductor chip is mounted. Each outer lead 93 is bent in gull-wing form. Further, the heat sink 106 has protrusions 92 which project from the four corners of the resin encapsulater 91 outside the resin encapsulater 91.

As shown in FIG. 18, the other main surface (unloaded surface) 107 on the side opposite to the main surface of the heat sink 106 is separated into plural form by a rein (resin encapsulater 91) embedded in each trench 5, which in turn constitute exposed regions 97, 98, 99, 100, 101, 102, 103, 104 and 105 exposed from the resin encapsulater 91. Of these exposed regions, the exposed regions 102, 103, 104 and 105 are respectively continuously connected to the protrusions 92 which project from the four corners of the resin encapsulater 91 outside the resin encapsulater 91.

The exposed region 101 is positioned substantially in the center of the other main surface (unloaded surface) 107 of the heat sink 106. Further, the exposed regions 97, 98, 99 and 100 are respectively located among the exposed regions 102, 103, 104 and 105 and provided at positions along the four sides of the other main surface 107.

Dimensions of respective parts employed in the semiconductor device according to the fourth embodiment will next be described based on FIG. 18. The thickness of the resin encapsulater 91 is 1.4 mm, the length thereof is 14 mm and the width thereof is 14 mm. The thickness of each outer lead 93 is 0.15 mm. The main surface (loaded surface) of the heat sink 106 has a length of 6.5 mm and a width of 6.5 mm. The thickness of the heat sink 106 is 0.6 mm. The trench 5 defined between the adjacent exposed regions has a width of 0.25 mm. The depth of the trench 5 is 0.07 mm.

The forms and dimensions of the exposed regions 97, 98, 99, 100, 101, 102, 103, 104 and 105 on the other main surface 107 of the heat sink 106 are as follows: The exposed regions 97, 98, 99 and 100 are shaped in the form of rectangles whose lengths and widths are 3 mm and 1.5 mm, respectively. The exposed region 101 is shaped in the form of a quadrangle whose length and width are 3 mm and 3 mm respectively. Further, each of the exposed regions 102, 103, 104 and 105 has a shape whose length and width are 3 mm and 3 mm respectively. Furthermore, the exposed regions 102, 103, 104 and 105 are respectively connected to the protrusions 92 by connecting portions 108.

Owing to the separation of the other main surface 107 of the heat sink into plural form in this way, brazing filler metal (solder) connecting portions on the other main surface 107 of the heat sink which serves as the semiconductor chip loading portion, result in a plurality of regions when the resin encapsulated semiconductor device having the heat sink is mounted on the printed circuit board by the brazing filler metal (solder). Further, the area of each of the plurality of regions is smaller than that of the heat sink serving as the semiconductor chip loading portion. Therefore, the molten brazing filler metal (solder) is not made one-sided or unbalanced, so that satisfactory mounting can be carried out.

While the invention completed by the present inventors above has been described specifically by the first to fourth embodiments, the present invention is not limited to the embodiments. It is needless to say that various changes can be made thereto within the scope not departing from the substance thereof.

Figure 19A:
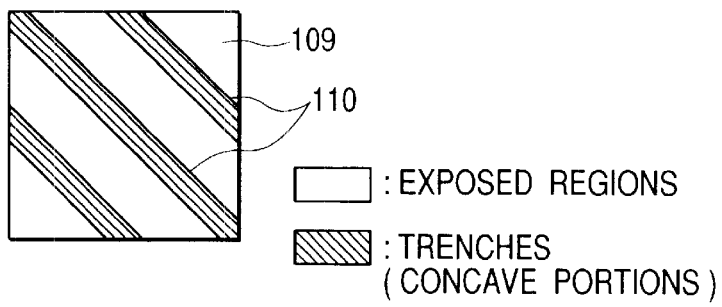
FIG. 19 is a plan view illustrating a modification of a tub or heat sink corresponding to a semiconductor chip loading portion according to the present invention.
Figure 19B:
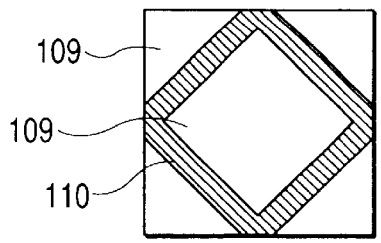
Figure 19C:
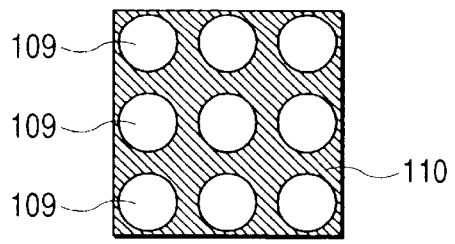
Figure 20:
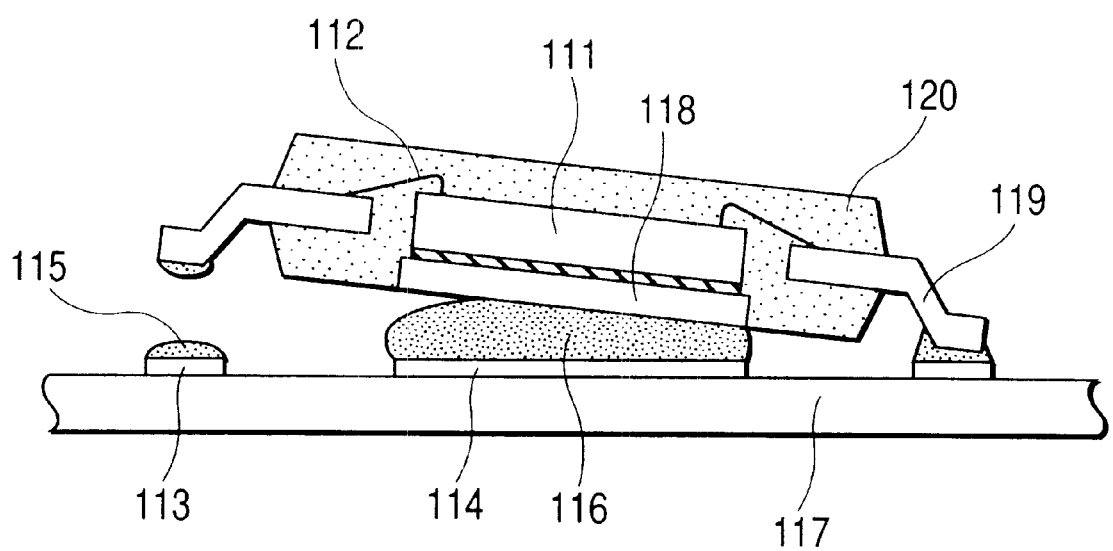
FIG. 20 is a cross-sectional view showing a mounted state indicative of a mounting failure developed in a prior art.

The form of the other main surface (unloaded surface) of the tub or heat sink used as the semiconductor chip loading portion may be set to such shapes as shown in FIGS. 19(*a*) through 19(*c*). FIG. 19(*a*) shows a case in which a plurality of trenches 110 are diagonally defined. Further, FIG. 19(*b*) shows a case in which a trench 110 is shaped in rhombic form so as to surround central portions of other main surfaces (unloaded surfaces) of a tub and a heat sink, and exposed regions 109 are formed so as to serve as a central portion and corners of the tub and heat sink. Furthermore, FIG. 19(*c*) shows a case in which a trench 110 is defined so that exposed regions 109 become a plurality of circles.

As a brazing filler metal (solder) used when a semiconductor device is mounted on a printed circuit board, Pb—Sn solder, Pb solder or Sn solder is principally used.

However, In solder or Au solder may be used as another example. On the other hand, the recently talked about Pb-free solder may be used.

A solder resist may be used in place of the trenches 5 defined in the other main surfaces (unloaded surfaces) of the tubs 8, 67 and 80 and heat sink 106 which have been described in the first to fourth embodiments respectively. Namely, a solder resist is formed in portions corresponding to trench forming points on the other main surfaces (unloaded surfaces) of the tubs 8, 67 and 80 and heat sink 106, whereby regions other than the regions in which the solder resist is formed; result in solder forming regions. Since the solder resist is also a substance hard to get wet with solder, no solder is wet in and spread over the regions in which the solder resist is formed. The trenches shown in FIGS. 19(*a*) through 19(*c*) may be formed by the solder resist.

Further, the lands 43, 64 and 85 respectively formed on the printed circuit boards 40, 62 and 83, which have been described in the first to fourth embodiments, may be formed by patterning the solder resist. Namely, a non-separated metal layer is formed in place of the formation of the lands 43, 64 and 85 respectively separated on the printed circuit boards 40, 62 and 83, and the surface of the metal layer is separated into a plurality of regions by a solder resist, whereby a plurality of regions corresponding to the lands referred to above are formed.

Advantageous effects obtained by a typical one of the inventions disclosed in the present application will be described in brief as follows:

Owing to the separation of the other main surface of a tub or heat sink serving as a semiconductor chip loading portion into plural form, exposed region, i.e., brazing filler metal (solder) connecting portions on the other main surface of the semiconductor chip loading portion are represented in plural form, and the area of each of the regions is smaller than that of the semiconductor chip loading portion. Therefore, the amount of the brazing filler metal (solder) with which a plurality of lands are respectively filled, may be reduced. Since a resin embedded in each trench is a substance hard to be wet with the brazing filler metal (solder), the brazing filler metal (solder) is not wet to and spread over those other than the plurality of exposed regions on the other main surface (unloaded surface) of the semiconductor chip loading portion.

Thus, when a resin encapsulated semiconductor device is mounted on a printed circuit board by a brazing filler metal (solder), the molten brazing filler metal (solder) is not made one-sided or unbalanced and reliably connects between the plurality of exposed regions and the plurality of lands corresponding thereto, whereby satisfactory mounting can be carried out.

The brazing filler metal (solder) is applied only to peripheral exposed regions easy to transfer heat except for a central region of the plurality of exposed regions on the back of the semiconductor chip loading portion, whereby the dismounting of the resin encapsulated semiconductor device from the printed circuit board becomes easy upon repair so that the repair is facilitated.

Since the trenches defined in the back of the semiconductor chip loading portion are shaped in continuous lattice form and formed so as to be bare in the sides of the semiconductor chip loading portion, the resin, which flows along tub sling leads and flows along the sides of the semiconductor chip loading portion, can be easily injected into the trenches, and the trenches shaped in lattice form can be buried by the resin.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor device, comprising:

a resin encapsulater;

a semiconductor chip located within said resin encapsulater and having a plurality of electrodes on one main surface;

a semiconductor chip loading portion disposed within said resin encapsulater and having a loaded surface for mounting said semiconductor chip thereon and an unloaded surface provided on the side opposite to the loaded surface, said unloaded surface being a surface to be soldered to a printed circuit board; and a plurality of input/output leads which are connected to said plurality of electrodes to input signals to said plurality of electrodes of said semiconductor chip or output signals from said plurality of electrodes thereof and which extend outside said resin encapsulater; and wherein the unloaded surface of said semiconductor chip loading portion comprises a plurality of regions separated from one another and said plurality of regions are exposed from said resin encapsulater to provide a plurality of soldering areas between said plurality of exposed regions of the other main surface and said printed circuit board, said plurality of soldering areas being mutually separated from one another in a plane view.

2. A semiconductor device, comprising:

a semiconductor chip having a plurality of electrodes on one main surface;

a semiconductor chip loading portion having a main surface on which said semiconductor chip is mounted;

a plurality of input/output leads which are connected to said plurality of electrodes to input signals to said plurality of electrodes of said semiconductor chip or output signals from said plurality of electrodes thereof and which extend in a direction far away from said semiconductor chip; and a resin encapsulater which seals said semiconductor chip, said semiconductor chip loading portion and some of said plurality of input/output leads; and wherein the other main surface of said semiconductor chip loading portion, which is a surface to be soldered to a printed circuit board and is provided on the side opposite to the main surface on which said semiconductor chip is mounted, is separated into a plurality of regions by a substance hard to be wet with a brazing filler metal and exposed from said resin encapsulater to provide a plurality of soldering areas between said plurality of exposed regions of the other main surface and said printed circuit board, said plurality of soldering areas being mutually separated from one another in a plane view.

3. A semiconductor device, comprising:

a semiconductor chip having a plurality of electrodes on one main surface;

a semiconductor chip loading portion having a main surface on which said semiconductor chip is mounted;

a plurality of inner leads having one ends adjacent to said semiconductor chip;

a plurality of outer leads integral with said plurality of inner leads respectively;

connectors which respectively electrically connect said plurality of electrodes of said semiconductor chip and said plurality of inner leads to one another; and a resin encapsulater which seals said semiconductor chip, said semiconductor chip loading portion and said plurality of inner leads; and wherein the other main surface of said semiconductor chip loading portion, which is provided on the side opposite to the main surface on which said semiconductor chip is mounted, is exposed from said resin encapsulater, the other main surface being a surface to be soldered to a printed circuit board, and the other main surface of said semiconductor chip loading portion, which is exposed from said resin encapsulater, is comprised of a plurality of exposed regions separated from one another by a substance hard to be wet with a brazing filler metal to provide a plurality of soldering areas between said plurality of exposed regions of the other main surface and said printed circuit board, said plurality of soldering areas being mutually separated from one another in a plane view.

4. The semiconductor device according to claim 3, wherein the main surface on which said semiconductor chip is mounted, is provided at a position lower than surfaces of said inner leads, which are provided on the side of the connection of said inner leads to said plurality of electrodes of said semiconductor chip.

5. The semiconductor device according to claim 4, wherein the substance hard to be wet with said brazing filler metal is a resin.

6. The semiconductor device according to claim 5, wherein said resin is the same resin as a resin which constitutes said resin encapsulater.

7. The semiconductor device according to claim 3, wherein the other main surface of said semiconductor chip loading portion is separated into a plurality of exposed regions by resin regions formed in parallel crosses.

8. The semiconductor device according to claim 3, wherein the other main surface of said semiconductor chip loading portion is separated into a plurality of exposed regions by a plurality of diagonally-shaped resin regions.

9. The semiconductor device according to claim 3, wherein the other main surface of said semiconductor chip loading portion is separated into a plurality of exposed regions by rhombic resin regions.

10. The semiconductor device according to claim 3, wherein the plurality of exposed regions separated from one another by the resin, of the other main surface of said semiconductor chip loading portion are a plurality of circular exposed regions.

11. The semiconductor device according to claim 3, 8, 9 or 10, wherein said connectors for electrically connecting the plurality of electrodes of said semiconductor chip and said inner leads are bonding wires.

12. The semiconductor device according to claim 3, wherein said plurality of outer leads are shaped in gull-wing form.

13. A semiconductor device, comprising:

a semiconductor chip having a plurality of electrodes on one main surface;

a semiconductor chip loading portion having a main surface on which said semiconductor chip is mounted;

a plurality of inner leads having one ends adjacent to said semiconductor chip;

a plurality of outer leads integral with said plurality of inner leads respectively;

connectors which respectively electrically connect said plurality of electrodes of said semiconductor chip and said plurality of inner leads to one another; and a resin encapsulater which seals said semiconductor chip, said semiconductor chip loading portion and said plurality of inner leads; and wherein the other main surface of said semiconductor chip loading portion, which is provided on the side opposite to the main surface on which said semiconductor chip is mounted, is exposed from said resin encapsulater, the other main surface being a surface to be soldered to a printed circuit board, and the other main surface of said semiconductor chip loading portion, which is exposed from said resin encapsulater, is comprised of a plurality of exposed regions separated from one another by a resin embedded in said semiconductor chip loading portion from the other main surface of said semiconductor chip loading portion to provide a plurality of soldering areas between said plurality of exposed regions of the other main surface and said printed circuit board, said plurality of soldering areas being mutually separated from one another in a plane view.

14. The semiconductor device according to claim 13, wherein the resin embedded in said semiconductor chip loading portion is a resin embedded in recessed portions defined in the other main surface of said semiconductor chip loading portion.

15. The semiconductor device according to claim 14, wherein said recessed portions are formed by etching the other main surface of said semiconductor chip loading portion.

16. The semiconductor device according to claim 14, wherein said recessed portions are notches defined in the other main surface of said semiconductor chip loading portion.

17. The semiconductor device according to claim 14, wherein said recessed portions are formed by pressing the other main surface of said semiconductor chip loading portion.

18. The semiconductor device according to claim 14, wherein said recessed portions are formed by grinding the other main surface of said semiconductor chip loading portion.

19. The semiconductor device according to claim 13, wherein the resin embedded in said semiconductor chip loading portion from the other main surface of said semiconductor chip loading portion is formed on said other main surface in the form of parallel crosses.

20. The semiconductor device according to claim 13, wherein the resin embedded in said semiconductor chip loading portion from the other main surface of said semiconductor chip loading portion is formed on said other main surface in plural diagonal shapes.

21. The semiconductor device according to claim 13, wherein the resin embedded in said semiconductor chip loading portion from the other main surface of said semiconductor chip loading portion is formed on said other main surface in rhombic form.

22. The semiconductor device according to claim 13, wherein a plurality of circular exposed regions are formed on said other main surface by the resin embedded in said semiconductor chip loading portion from the other main surface of said semiconductor chip loading portion.

23. The semiconductor device according to claim 13, wherein said connectors for electrically connecting said plurality of electrodes of said semiconductor chip and said inner leads to one another are bonding wires.

24. The semiconductor device according to claim 13, wherein said plurality of outer leads are formed in gull-wing form.

25. A semiconductor device, comprising:

a resin encapsulater;

a semiconductor chip located inside said resin encapsulater and having a plurality of electrodes on one main surface;

a semiconductor chip loading portion having a loaded surface for mounting said semiconductor chip thereon and an unloaded surface provided on the side opposite to the loaded surface, said unloaded surface being a surface to be soldering to a printed circuit board;

a plurality of inner leads having one ends adjacent to said semiconductor chip; and connectors which respectively electrically connect said plurality of electrodes of said semiconductor chip and said plurality of inner leads to one another; and wherein the other ends of said plurality of inner leads are integral with a plurality of outer leads extending outside said resin encapsulater, and said unloaded surface of said semiconductor chip loading portion is comprised of a plurality of regions separated from one another by a solder resist, said plurality of regions being exposed from one surface of said resin encapsulater to provide a plurality of soldering areas between said plurality of exposed regions of the other main surface and said printed circuit board, said plurality of soldering areas being mutually separated from one another in a plane view.

26. The semiconductor device according to claim 25, wherein said connectors for electrically connecting said plurality of electrodes of said semiconductor chip and said plurality of inner leads to one another respectively are bonding wires.

27. The semiconductor device according to claim 26, wherein said plurality of outer leads are formed in gull-wing form.

28. A semiconductor device, comprising:

a resin encapsulater;

a semiconductor chip located inside said resin encapsulater and having a plurality of electrodes on one main surface;

a semiconductor chip loading portion having a loaded surface for mounting said semiconductor chip thereon and an unloaded surface provided on the side opposite to said loaded surface, said unloaded surface being a surface to be soldered to a printed circuit board;

a plurality of inner leads having one ends adjacent to said semiconductor chip; and connectors which respectively electrically connect said plurality of electrodes of said semiconductor chip and said plurality of inner leads to one another; and wherein the other ends of said plurality of inner leads are integral with a plurality of outer leads extending outside said resin encapsulater, and said unloaded surface of said semiconductor chip loading portion is comprised of a plurality of regions separated from one another by a substance hard to be wet with solder which selectively protrude from said unloaded surface, said plurality of regions being exposed from one surface of said resin encapsulater to provide a plurality of soldering areas between said plurality of exposed regions of the other main surface and said printed circuit board, said plurality of soldering areas being mutually separated from one another in a plane view.

29. The semiconductor device according to claim 28, wherein said connectors for electrically connecting said plurality of electrodes of said semiconductor chip and said plurality of inner leads to one another respectively are bonding wires.

30. The semiconductor device according to claim 29, wherein said plurality of outer leads are formed in gull-wing form.

31. A semiconductor device, comprising:

a semiconductor chip having a plurality of electrodes on one main surface;

a tub having a main surface on which said semiconductor chip is mounted;

a plurality of inner leads having one ends adjacent to said semiconductor chip;

Ia plurality of outer leads integral with said plurality of inner leads respectively;

connectors which respectively electrically connect said plurality of electrodes of said semiconductor chip and said inner leads to one another; and a resin encapsulater which seals said semiconductor chip, said tub and said plurality of inner leads; and wherein the other main surface of said tub, which is a surface to be soldered to a printed circuit board and is provided on the side opposite to the main surface on which said semiconductor chip is mounted, is exposed from said resin encapsulater, and the other main surface of said tub, which is exposed from said resin encapsulater, is comprised of a plurality of exposed regions separated from one another by a substance hard to be wet with solder to provide a plurality of soldering areas between said plurality of exposed regions of the other main surface and said printed circuit board, said plurality of soldering areas being mutually separated from one another in a plane view.

32. The semiconductor device according to claim 31, wherein the substance hard to be wet with the solder, which separates the other main surface of said tub into said plurality of exposed regions, comprises a resin.

33. The semiconductor device according to claim 32, wherein said resin is a resin for said resin encapsulater.

34. The semiconductor device according to claim 31, wherein said connectors for electrically connecting said plurality of electrodes of said semiconductor chip and said inner leads to one another respectively, are bonding wires.

35. The semiconductor device according to claim 31, wherein said plurality of outer leads are shaped in gull-wing form.

\* \* \* \* \*